United States Patent
Ooi

(10) Patent No.: US 9,233,455 B2
(45) Date of Patent: Jan. 12, 2016

(54) CHUCKING DEVICE AND CHUCKING METHOD

(75) Inventor: Hiroyuki Ooi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 1080 days.

(21) Appl. No.: 13/302,360

(22) Filed: Nov. 22, 2011

(65) Prior Publication Data

US 2012/0139192 A1   Jun. 7, 2012

(30) Foreign Application Priority Data

Dec. 2, 2010 (JP) ................................. 2010-269819

(51) Int. Cl.
*B25B 11/00* (2006.01)
*H01L 21/683* (2006.01)
*H01L 21/687* (2006.01)
*B23B 31/30* (2006.01)
*B26D 7/01* (2006.01)

(52) U.S. Cl.
CPC .......... *B25B 11/005* (2013.01); *H01L 21/6838* (2013.01); *H01L 21/6875* (2013.01); *Y10T 29/49998* (2015.01); *Y10T 29/53191* (2015.01); *Y10T 279/11* (2015.01)

(58) Field of Classification Search
CPC   B25B 11/005; B25B 11/007; H01L 21/6838; H01L 21/6875; Y10T 279/11; Y10T 29/49998; Y10T 29/53191; B23B 31/307; B26D 7/018
USPC ............................ 29/559, 743; 269/21; 279/3
See application file for complete search history.

(56) References Cited

U.S. PATENT DOCUMENTS

| 1,121,452 | A | * | 12/1914 | Bagnall | 451/388 |
| 3,627,338 | A | * | 12/1971 | Thompson | 279/3 |
| 3,747,282 | A | * | 7/1973 | Katzke | 451/388 |
| 4,213,698 | A | * | 7/1980 | Firtion et al. | 355/77 |
| RE31,053 | E | * | 10/1982 | Firtion et al. | 355/77 |
| 4,811,523 | A | * | 3/1989 | Schmitz et al. | 451/285 |
| 5,374,829 | A | * | 12/1994 | Sakamoto et al. | 250/453.11 |

(Continued)

FOREIGN PATENT DOCUMENTS

JP  60-15147 A  4/1985
JP  01-129438 A  5/1989

(Continued)

OTHER PUBLICATIONS

Foreign Office Action issued on Feb. 4, 2014 with an English translation.

(Continued)

*Primary Examiner* — Jermie Cozart
*Assistant Examiner* — Bayan Salone
(74) *Attorney, Agent, or Firm* — Rabin & Berdo, P.C.

(57) ABSTRACT

A chucking device is disclosed. The chucking device includes plural protruding portions that support the central portion of a semiconductor substrate and that are provided on a base portion. The chucking device also includes a cylindrical peripheral portion that supports the outer peripheral portion of the semiconductor substrate, plural suction holes that chuck the semiconductor substrate, and a vacuum source that vacuum draws the plural suction holes at differing timings. A plurality of mutually independent vacuum drawable suction holes are provided in at least one portion of the protruding portions.

14 Claims, 16 Drawing Sheets

(56) References Cited

U.S. PATENT DOCUMENTS

| | | | |
|---|---|---|---|
| 5,700,725 A * | 12/1997 | Hower et al. | 438/758 |
| 6,196,532 B1 * | 3/2001 | Otwell | 269/21 |
| 6,394,797 B1 * | 5/2002 | Sugaya et al. | 432/253 |
| 6,402,843 B1 * | 6/2002 | Siniaguine et al. | 118/500 |
| 6,446,948 B1 * | 9/2002 | Allen | 269/21 |
| 6,464,790 B1 * | 10/2002 | Sherstinsky et al. | 118/715 |
| 6,513,796 B2 * | 2/2003 | Leidy et al. | 269/21 |
| 6,672,576 B1 * | 1/2004 | Walker | 269/21 |
| 6,805,338 B1 * | 10/2004 | Okuda | 269/21 |
| 6,863,281 B2 * | 3/2005 | Endou et al. | 279/128 |
| 7,607,647 B2 * | 10/2009 | Zhao et al. | 269/21 |
| 7,889,323 B2 * | 2/2011 | Sung | 355/73 |
| 7,992,877 B2 * | 8/2011 | Balan | 279/3 |
| 8,336,182 B2 * | 12/2012 | Van Valkenburg | 29/426.1 |
| 8,465,011 B2 * | 6/2013 | Segawa et al. | 269/21 |
| 8,832,924 B2 * | 9/2014 | Mizubata | 29/559 |
| 2002/0117792 A1 * | 8/2002 | Leidy et al. | 269/21 |
| 2003/0001103 A1 * | 1/2003 | Kobayashi et al. | 250/440.11 |
| 2003/0160042 A1 * | 8/2003 | Hiramatsu et al. | 219/444.1 |
| 2007/0152690 A1 * | 7/2007 | Sung | 324/761 |
| 2010/0301534 A1 * | 12/2010 | Im | 269/21 |
| 2013/0264780 A1 * | 10/2013 | Iwashita et al. | 279/3 |

FOREIGN PATENT DOCUMENTS

| | | | |
|---|---|---|---|
| JP | 03-102850 A | 4/1991 | |
| JP | 2574818 | 1/1997 | |
| JP | 09-295236 A | 11/1997 | |
| JP | 10-128633 A | 5/1998 | |
| JP | 2821678 | 11/1998 | |
| JP | 11-124231 A | 5/1999 | |
| JP | 2002-233808 A | 8/2002 | |
| JP | 2003-051466 A | 2/2003 | |
| JP | 2003-086664 A | 3/2003 | |
| JP | 2003-249542 A | 9/2003 | |
| JP | 2003-324143 A | 11/2003 | |
| JP | 2004-006485 A | 1/2004 | |
| JP | 2004-165643 A | 6/2004 | |
| JP | 2004-221323 A | 8/2004 | |
| JP | 2004-259792 A | 9/2004 | |
| JP | 2004-260191 A | 9/2004 | |
| JP | 2004-303961 A | 10/2004 | |
| JP | 2005-116842 A | 4/2005 | |
| JP | 2006-054286 A | 2/2006 | |
| JP | 2006-068592 A | 3/2006 | |
| JP | 2007-048828 A | 2/2007 | |
| JP | 2007-322806 A | 12/2007 | |
| JP | 2007322806 * | 12/2007 | G03F 7/20 |
| JP | 2008-041761 A | 2/2008 | |
| JP | 4298078 A | 7/2009 | |
| JP | 2010-062345 A | 3/2010 | |
| JP | 2010-166085 A | 7/2010 | |
| JP | 2010-177607 A | 8/2010 | |
| JP | 2010-231216 A | 10/2010 | |
| WO | WO-01/78455 A1 | 10/2001 | |
| WO | WO 03-006971 A1 | 1/2003 | |
| WO | WO 2009020051 A1 * | 2/2009 | |

OTHER PUBLICATIONS

Japanese Office Action dated Dec. 16, 2014 with its partial English translation.

* cited by examiner

CHUCKING DEVICE AND CHUCKING METHOD

CROSS REFERENCE TO RELATED APPLICATION

The entire disclosure of the inventor's corresponding Japanese patent application, Serial No. JP PA 2010-269819, filed Dec. 2, 2010, is hereby incorporated by reference.

BACKGROUND OF THE INVENTION

1. Technical Field

The present invention relates to a chucking device and chucking method.

2. Related Art

In recent years, the importance of a power semiconductor device such as an insulated gate bipolar transistor (IGBT) or insulated gate type field effect transistor (MOSFET) as an environment-adaptive electronic device is increasing. A chucking device that holds a semiconductor substrate by vacuum chucking has been proposed in order to convey a semiconductor substrate along a manufacturing line, or fix the semiconductor substrate to a support stand, in the manufacturing step of the semiconductor device.

FIG. 20 is an illustration showing a heretofore known chucking device. The chucking device shown in FIG. 20 includes a base portion 101 in which ring-like or radial groove portions 102 are provided. Ventilation holes (a vacuum system) 103 and 104 linked to the groove portions 102 are vacuum drawn, thereby vacuum adsorbing a semiconductor substrate 1 onto the base portion 101 (for example, refer to U.S. Pat. No. 3,627,338 (FIG. 1), U.S. Pat. No. 3,747,282 (FIG. 1), and Japanese Patent No. 2,821,678).

Also, as another device, there is proposed a chucking method of a type (pin chuck type) whereby pin-like protruding portions that hold a semiconductor substrate are provided on the surface of a base portion, and the semiconductor substrate is held on the protruding portions. FIG. 21 is an illustration showing a heretofore known pin chuck type chucking device. Also, FIG. 22 is a plan view showing the chucking device of FIG. 21. The chucking device shown in FIGS. 21 and 22 includes a base portion 111 on which are provided a plurality of pin-like protruding portions 112 that are in contact with the central portion of the semiconductor substrate 1, a cylindrical peripheral portion 113 that is in contact with the outer peripheral portion of the semiconductor substrate 1, and a ventilation hole (a vacuum system) 114 that vacuum draws a space surrounded by the semiconductor substrate 1, base portion 111, and peripheral portion 113. The space surrounded by the semiconductor substrate 1, base portion 111, and peripheral portion 113 is vacuum drawn (e.g., a vacuum is generated therein) via the ventilation hole 114, bringing the semiconductor substrate 1 into contact with, and holding it on, the protruding portions 112 and peripheral portion 113 (for example, refer to JP-B-60-15147 (FIG. 2)).

However, with the pin chuck type chucking device, a portion of the semiconductor substrate 1 not in contact with the protruding portions 112 and peripheral portion 113 sags partially due to suction force when vacuum drawn. As a chucking device that eliminates this kind of problem, there is proposed a device such that, on a vacuum chucking fixed stand including a central portion having a plurality of protruding portions and an outer peripheral portion having a groove portion, the array pitch of the protruding portions is 2 mm or less, and the central portion and outer peripheral portion are each configured in such a way as to be evacuable (for example, refer to Japanese Patent No. 2,574,818).

In Japanese Patent No. 2,574,818, by simulating one portion of a semiconductor substrate supported between one protruding portion and an adjacent protruding portion of the pin-like protruding portions disposed in a lattice form with a model of a support beam with both ends free supported by the protruding portions, and calculating the concentrated load exerted on the protruding portions, the interval between the adjacent protruding portions (the array pitch) is calculated to be 2 mm or less. At this time, the thickness of the semiconductor substrate is 0.4 mm, and the tolerance range of the sagging of the semiconductor substrate between the protruding portions is −0.5 μm or more, +0.5 μm or less.

Also, with the pin chuck type chucking device, a problem occurs in that, due to the sagging of the semiconductor substrate between the protruding portions, the position of the point of contact of the semiconductor substrate surface with each protruding portion deviates more (hereafter referred to as wafer distortion) in comparison with a case of placing the semiconductor substrate on the protruding portions without vacuum drawing.

As a device that reduces the wafer distortion, there is proposed a device that includes a plurality of protruding portions for supporting a semiconductor substrate, and chucks and holds the semiconductor substrate supported on the protruding portions, wherein the optimal setting values of the array pitch of the protruding portions and the chucking force of the semiconductor substrate are set based on the thickness of the semiconductor substrate, the lattice density of the semiconductor substrate, the static friction coefficient of the semiconductor substrate, and the maximum acceleration of a stage on which the chucking device is placed (for example, refer to Japanese Patent No. 4,298,078).

With the technology shown in Japanese Patent No. 4,298,078, it is proposed that when holding a semiconductor substrate with a diameter of 200 mm (eight inches) using a pin chuck type chucking device having protruding portions arrayed in a lattice form, with the interval between adjacent protruding portions at 2 mm, the relationship between a chucking force P (N/m$^2$) holding the semiconductor substrate and an interval (array pitch) L (m) between adjacent protruding portions satisfies Equation 1 and Equation 2 below when adopting a semiconductor substrate flatness tolerance value of 80 nm and a wafer distortion tolerance value of 5 nm for a 0.25 μm rule semiconductor process with a longitudinal elastic modulus of $1.69 \times 10^{11}$ (N/m), and a semiconductor substrate thickness of 725 μm.

$$P \leq 0.0033/L^3 \tag{1}$$

$$L \leq 0.0125 \tag{2}$$

Also, as another pin chuck type holding device, there is proposed a device including a plurality of protruding portions having a substrate placement surface on which a substrate is placed, a suction hole opening on the substrate placement surface formed in at least one of the plural protruding portions, and a base portion on which are provided the plurality of protruding portions, wherein the substrate placement surfaces of the plurality of protruding portions are disposed in the same horizontal plane (for example, refer to JP-A-2007-322806).

Also, as another pin chuck type chucking device, the following kind of device is proposed. A cooling mechanism is provided inside a plate main body of a cooling plate device acting as a chucking plate device, cooling a substrate placed on a placement surface of the plate main body. Plural support protrusions and plural auxiliary protrusions are formed on the placement surface of the plate main body, and the substrate is supported by first and second apex portion end surfaces of each of the support protrusions and auxiliary protrusions. A vacuum suction hole for vacuum sucking the substrate is formed in each support protrusion. Of each support protrusion, the first apex portion end surface in contact with the substrate has the kind of smoothness that adheres closely to the substrate when vacuum drawing the substrate to the vacuum suction hole (for example, refer to JP-A-2004-303961).

However, as a result of dedicated research by the inventor, the following has become clear. The thickness of a semiconductor substrate after the semiconductor device is completed in, for example, an IGBT is finished to in the region of 180 to 300 μm in a 1,800V breakdown voltage class, in the region of 120 to 200 μm in a 1,200V breakdown voltage class, and in the region of 60 to 90 μm in a 600V breakdown voltage class.

Furthermore, by adopting a trench gate type of gate structure, the thickness of the semiconductor substrate corresponding to the breakdown voltage class is designed to be smaller than in a planar gate type semiconductor device. For example, the thickness of the semiconductor substrate after completion in a 600V breakdown voltage class trench gate type IGBT is in the region of 60 μm in the smallest case. There is a tendency for heavy use to be made of trench gate type gate structures, with an object of more effectively producing semiconductor devices. In this way, the thickness of the semiconductor substrate easily falls below 100 μm.

Also, recently, an increase in the diameter of a semiconductor substrate made from silicon from, for example, a diameter of six inches to a diameter of eight inches is being pursued, and an improvement in semiconductor device productivity is being sought. However, when a semiconductor substrate with a diameter of eight inches is reduced to a thickness of in the region of 60 μm in the manufacturing step of a power semiconductor device such as an IGBT, the warpage of the semiconductor substrate increases markedly. Because of this, with the kinds of technology shown in the heretofore described patent documents, it is difficult to chuck or convey a thinner semiconductor substrate or markedly warped semiconductor substrate in a condition in which the flatness of the semiconductor substrate is maintained or increased.

For example, in U.S. Pat. No. 3,627,338 (FIG. 1), U.S. Pat. No. 3,747,282 (FIG. 1), and Japanese Patent No. 2,821,678 (refer to FIG. 20), foreign objects such as dirt or dust become trapped between the semiconductor substrate 1 and a portion 105, other than the groove portions 102, of the base portion 101. When the semiconductor substrate 1 is made thinner as heretofore described, a portion of the semiconductor substrate 1 in contact with a foreign object easily becomes distorted. Also, with the technology shown in JP-B-60-15147 (refer to FIGS. 21 and 22) too, as the portion of the semiconductor substrate 1 not in contact with the protruding portions 112 and peripheral portion 113 sags convexly on the base portion 111 side owing to the suction force when the semiconductor substrate 1 is vacuum drawn, the semiconductor substrate 1 is considerably distorted, and the flatness decreases. As a result of this, for example, exposure resolution in an exposure step decreases markedly.

Also, as disclosed in the technology shown in Japanese Patent No. 4,298,078, when adsorbing a currently mainstream 200 mm (eight inch) diameter semiconductor substrate with a pin chuck type chucking device having protruding portions arrayed in a lattice form, with the interval between adjacent protruding portions at 2 mm, a wafer distortion of approximately 1/2.6 times the flatness of the semiconductor substrate occurs. In the case of the currently mass produced 0.25 μm rule semiconductor process, while the semiconductor substrate flatness tolerance value, taken as ten percent of the 800 nm focal depth, is 80 nm, the tolerance value of the wafer distortion, taken as ten percent of the 50 nm overlay accuracy, is 5 nm. In order to keep the wafer distortion within 5 nm, it is necessary that the semiconductor substrate flatness tolerance value is 13 (=5×2.6) nm, which is far smaller than the 80 nm tolerance value. That is, the semiconductor substrate flatness required for overlay accuracy is far stricter than the semiconductor substrate flatness required for focal depth.

With the technology shown in Japanese Patent No. 4,298,078, when the thickness of the semiconductor substrate is 0.1 mm, it is necessary that the relationship between the chucking force P adsorbing the semiconductor substrate and the interval L between adjacent protruding portions satisfies Equation 3 and Equation 4 below in order to reduce the wafer distortion. To this end, it is necessary that the interval L between adjacent protruding portions is 1.72 mm or less, and that the chucking force holding the semiconductor substrate is 12.4 kN/m² or less.

$$P \leq 0.000063/L^3 \quad (3)$$

$$L \leq 0.00172 \quad (4)$$

However, as heretofore described, the IGBT power semiconductor device warpage is large, for example, in the case of an eight inch diameter semiconductor substrate, it is not unusual that the semiconductor substrate warpage exceeds 1 mm. Because of this, in order to eliminate the warpage occurring in the semiconductor substrate, and to chuck and hold the semiconductor substrate in a sufficiently stable condition, it is normally necessary that the chucking force holding the semiconductor substrate is in the region of 40 kN/m² when the thickness of the semiconductor substrate is in the region of 100 μm, which considerably exceeds the 12.4 kN/m² chucking force holding the semiconductor substrate that satisfies Equation 3 and Equation 4. Because of this, as shown in Japanese Patent No. 4,298,078, one portion of the semiconductor substrate supported with adjacent protruding portions as support points is considerably distorted, and the sagging and wafer distortion of the semiconductor device exceed the tolerance values required in the element design.

Also, with the technology shown in Japanese Patent No. 2,574,818, when the thickness of the semiconductor substrate is 100 μm, and the tolerance range of the sagging of the semiconductor substrate between protruding portions is the heretofore described −0.5 μm or more, +0.5 μm or less, the interval between adjacent protruding portions is approximately 0.7 mm or less. When the interval between adjacent protruding portions is approximately 0.7 mm or less when forming quadrangular pyramidic protruding portions on the base portion using an anisotropic etching, the width of an opening portion of a mask covering a region of the base portion that is not etched is too small, and it is difficult to control the amount removed by etching in the crystal plane orientation. Because of this, controllability of the heights of the protruding portions and the interval between adjacent protruding portions is lost.

SUMMARY OF THE INVENTION

The invention has an object of providing a chucking device and chucking method that can prevent a foreign object being caught between the device and a semiconductor substrate in order to eliminate the problems of the heretofore technology. An object is to provide a chucking device and chucking method that can hold the semiconductor substrate in a condition in which the semiconductor substrate flatness is maintained or increased.

In order to solve the heretofore described problems, and achieve the object of the invention, a chucking device according to a first aspect of the invention has the following characteristics. A chucking device with suction holes that suck a semiconductor substrate includes a base portion having a plurality of protruding portions that support the semiconductor substrate, plural the suction holes, vacuum drawable independently of each other, provided in at least one portion of the protruding portions, and a vacuum generating unit that vacuum draws the plural suction holes at differing timings.

Also, according to a second aspect of the invention, the chucking device according to the first aspect is such that the vacuum generating unit vacuum draws the suction holes sequentially from the suction holes provided in positions supporting the outer peripheral portion side of the semiconductor substrate toward the suction holes provided in positions supporting the central portion side, or from the suction holes provided in positions supporting the central portion side of the semiconductor substrate toward the suction holes provided in positions supporting the outer peripheral portion side.

Also, in order to solve the heretofore described problems, and achieve the object of the invention, a chucking device according to a third aspect of the invention has the following characteristics. A chucking device with suction holes that hold a semiconductor substrate includes a base portion having plural protruding portions that support the semiconductor substrate, plural the suction holes provided in at least one portion of the protruding portions, a vacuum generating unit that vacuum draws the plural suction holes, and a gas flow source that makes the flow velocity of the gas on the base portion side of the semiconductor substrate placed above the base portion greater than the flow velocity of the gas on the side opposite to the base portion side of the semiconductor substrate.

Also, according to a fourth aspect of the invention, the chucking device according to the third aspect further includes a control unit that controls the vacuum generating unit and gas flow source. Then, the control unit vacuum draws the suction holes using the vacuum generating unit after adjusting the gas flow velocity using the gas flow source.

Also, according to a fifth aspect of the invention, the chucking device according to the 1st to 4th aspects further includes a peripheral portion that supports the outer peripheral portion of the semiconductor substrate.

Also, according to a sixth aspect of the invention, the chucking device according to the fifth aspect is such that the suction holes that suck the outer peripheral portion of the semiconductor substrate are provided in the peripheral portion.

Also, according to a seventh aspect of the invention, the chucking device according to the 1st to 6th aspects are such that the suction hole is connected to a ventilation hole penetrating the protruding portion in which the suction hole is provided, and the inner diameter of the suction hole is greater than the inner diameter of the ventilation hole.

Also, according to an eighth aspect of the invention, the chucking device according to the 1st to 7th aspects are such that a chamfering process is carried out on an opening portion of the suction hole.

Also, according to a ninth aspect of the invention, the chucking device according to the 1st to 8th aspects are such that a chamfering process is carried out on an end portion on the side of the protruding portion that supports the semiconductor substrate.

Also, according to a tenth aspect of the invention, the chucking device according to the 1st to 9th aspects are such that a member formed from a material that absorbs an external force received from the semiconductor substrate supported by the protruding portion is provided on the end portion on the side of the protruding portion that supports the semiconductor substrate.

Also, according to an eleventh aspect of the invention, the chucking device according to the 1st to 10th aspects are such that the interval between adjacent protruding portions is wider on the side supporting the semiconductor substrate than on the base portion side.

Also, according to a twelfth aspect of the invention, the chucking device according to the 1st to 11th aspects are such that the width of the protruding portion in which no suction hole is provided is smaller than the width of the protruding portion in which the suction hole is provided.

Also, according to a thirteenth aspect of the invention, the chucking device according to the 1st to 12th aspects are such that the heights of the protruding portions from the surface of the base portion are all equal.

Also, according to a fourteenth aspect of the invention, the chucking device according to the 1st to 13th aspects are such that a screw portion is provided in the protruding portion. A screw hole that receives the screw portion of the protruding portion is provided in the base portion. Then, the screw portion of the protruding portion is screwed into the screw hole of the base portion so that the heights of the protruding portions from the surface of the base portion are all equal.

Also, according to a fifteenth aspect of the invention, the chucking device according to the 5th to 14th aspects are such that the protruding portion and peripheral portion support a portion farther to the interior than a peripheral portion on a main surface side of a semiconductor substrate, which has a stepped form owing to the peripheral portion left thickly around the outer perimeter.

Also, according to a sixteenth aspect of the invention, the chucking device according to the 5th to 13th aspects are such that the heights of the protruding portions from the surface of the base portion are greater than the height of the peripheral portion from the surface of the base portion.

Also, according to a seventeenth aspect of the invention, the chucking device according to the 5th to 16th aspects are such that the peripheral portion is provided in such a way as to be movable in a vertical direction with respect to the surface of the semiconductor substrate supported on the peripheral portion.

Also, according to an eighteenth aspect of the invention, the chucking device according to the 1st to 16th aspects further includes a movable holding portion that holds a semiconductor substrate above the protruding portion. Then, the control unit moves the holding portion in a direction such that the semiconductor substrate approaches the protruding portion and, after bringing the semiconductor substrate held by the holding portion into contact with the protruding portion, vacuum draws the suction hole using the vacuum generating unit.

Also, in order to solve the heretofore described problems, and achieve the object of the invention, a chucking method according to a nineteenth aspect of the invention has the following characteristics. A chucking method of a base portion having plural protruding portions that support a semiconductor substrate holds a semiconductor substrate to suction holes provided in the protruding portions. Firstly, a first chucking step of vacuum drawing at differing timings plural the suction holes, vacuum drawable independently of each other, provided in at least one portion of the protruding portions, thereby sucking the semiconductor substrate to the plural suction holes, is carried out.

Also, according to a twentieth aspect of the invention, the chucking method according to the nineteenth aspect is such that, in the first chucking step, chucking is carried out gradually from the outer peripheral portion of the semiconductor substrate toward the central portion, or from the central portion of the semiconductor substrate toward the outer peripheral portion.

Also, according to a twenty-first aspect of the invention, the chucking method according to the 19th or 20th aspects are such that the suction holes that chuck the outer peripheral portion of the semiconductor substrate are provided in a peripheral portion that supports the outer peripheral portion of the semiconductor substrate. Then, a second chucking step of vacuum drawing the suction holes provided in the peripheral portion at a timing differing from that of vacuum drawing the suction holes provided in the protruding portions, thereby chucking the outer peripheral portion of the semiconductor substrate to the suction holes provided in the peripheral portion, is carried out before or after the first chucking step.

Also, according to a twenty-second aspect of the invention, the chucking method according to the twenty-first aspect is such that the outer peripheral portion of the semiconductor substrate is chucked to the suction holes of the peripheral portion installed above the protruding portions in such a way as to be able to rise and descend in the second chucking step. Then, after the second chucking step, the first chucking step is carried out after lowering the peripheral portion, bringing the semiconductor substrate into contact with the protruding portions.

Also, according to a twenty-third aspect of the invention, the chucking method according to the 19th to 21st aspects are such that, firstly, the semiconductor substrate is held above the protruding portions using a holding portion, which can rise and descend, that holds the semiconductor substrate. Subsequently, the first chucking step is carried out after lowering the holding portion, bringing the semiconductor substrate into contact with the protruding portions.

Also, in order to solve the heretofore described problems, and achieve the object of the invention, a chucking method according to a twenty-fourth aspect of the invention has the following characteristics. A chucking method of a base portion having plural protruding portions that support a semiconductor substrate holds a semiconductor substrate to suction holes provided in the protruding portions. Firstly, a semiconductor substrate is placed above the base portion. Next, a gas flow generating step of making the flow velocity of the gas on the base portion side of the semiconductor substrate greater than the flow velocity of the gas on the side opposite to the base portion side of the semiconductor substrate is carried out. Next, a first chucking step of vacuum drawing plural the suction holes provided in at least one portion of the protruding portions, thereby chucking the semiconductor substrate to the plural suction holes, is carried out after the gas flow generating step.

Also, according to a twenty-fifth aspect of the invention, the chucking method according to the nineteenth aspect further includes an assembly step of aligning the heights of the protruding portions from the surface of the base portion, and attaching the protruding portions to the base portion, before the first chucking step.

Also, according to a twenty-sixth aspect of the invention, the chucking method according to the 19th to 24th aspects are such that an assembly step of attaching the protruding portions to the base portion is carried out before the first chucking step, and an adjustment step of aligning the heights of all the protruding portions from the surface of the base portion is carried out after the assembly step.

Also, according to a twenty-seventh aspect of the invention, the chucking method according to the 25th or 26th aspects are such that, in the assembly step, a screw portion provided in the protruding portion is screwed into a screw hole that receives the screw portion of the protruding portion provided in the base portion.

Also, according to a twenty-eighth aspect of the invention, the chucking method according to the 25th or 26th aspects are such that, in the assembly step, the protruding portion is inserted into a hole provided in the base portion that receives the protruding portion.

Also, according to a twenty-ninth aspect of the invention, the chucking method according to the twenty-sixth aspect is such that, in the adjustment step, the protruding portion is pressed against the base portion from the side of the protruding portion that supports the semiconductor substrate.

Also, according to a thirtieth aspect of the invention, the chucking method according to the twenty-sixth aspect is such that, in the adjustment step, the end portion on the side of the protruding portion that supports the semiconductor substrate is ground.

Also, according to a thirty-first aspect of the invention, the chucking method according to the twenty-sixth aspect is such that, in the adjustment step, the end portion on the side of the protruding portion that supports the semiconductor substrate is ground after the protruding portion is pressed against the base portion from the side of the protruding portion that supports the semiconductor substrate.

Also, according to a thirty-second aspect of the invention, the chucking method according to the 19th to 31st aspects are such that a surface to the interior side of a peripheral portion on a main surface side of a semiconductor substrate wherein the peripheral portion is left thickly around the outer perimeter, the main surface having a stepped form owing to the peripheral portion, is chucked.

According to the first to eighteenth aspects of the invention, plural protruding portions are provided on a base portion, and suction holes that chuck a semiconductor substrate are provided in the protruding portions. As the inner diameter of the suction hole is smaller than the interval between adjacent protruding portions, it is possible to make the area in contact with the semiconductor substrate small in comparison with that in a heretofore known chucking device (refer to FIGS. 21 and 22). Also, by adjusting the interval between adjacent protruding portions in accordance with the diameter, thickness, and warpage cycle of the semiconductor substrate, it is possible to hold the semiconductor substrate while eliminating the warpage of the semiconductor substrate.

Also, a peripheral portion that supports the outer peripheral portion of the semiconductor substrate is provided, and suction holes that chuck the semiconductor substrate are provided in the peripheral portion. Because of this, it is possible to chuck only the outer peripheral portion of the semiconductor substrate to the suction holes provided in the peripheral portion before chucking, or after chucking, the central portion of the semiconductor substrate to the suction holes provided in the protruding portions. By so doing, even when the semiconductor substrate is considerably warped, it is possible to hold the semiconductor substrate while eliminating the warpage of the semiconductor substrate. Also, by making the heights of the plural protruding portions equal, it is possible to hold the semiconductor substrate onto the base portion horizontally with respect to the base portion.

Also, the suction holes that chuck the semiconductor substrate are provided in the protruding portions and peripheral portion. Because of this, no external force caused by vacuum drawing is exerted on a portion of the semiconductor substrate between adjacent protruding portions, or between the protruding portion and peripheral portion. As the inner diameters of the suction holes are smaller than the interval between adjacent protruding portions, it is possible to reduce the vacuum chucking force exerted on the semiconductor substrate significantly in comparison with the heretofore known chucking device (refer to FIGS. 21 and 22), wherein a vacuum chucking force is exerted on a portion of the semiconductor substrate between adjacent protruding portions. Because of this, it is possible to keep the sagging and wafer distortion of the semiconductor substrate within the range of the tolerance values required in the element design.

Also, according to the first and second aspects of the invention, the vacuum generating unit vacuum draws each of the plural suction holes independently at differing timings. Because of this, when holding a semiconductor substrate warped convexly or concavely on the front surface side, it is possible to vacuum draw the plural suction holes in accordance with the warpage of the semiconductor substrate. Consequently, it is possible to hold the semiconductor substrate while eliminating the warpage of the semiconductor substrate.

Also, according to the third and fourth aspects of the invention, a gas flow generating unit that causes an inflow of gas is provided on the base portion side of the semiconductor substrate. Because of this, it is possible to exert a negative pressure caused by a Bernoulli effect on the semiconductor substrate, and place the semiconductor substrate on the protruding portions in a condition in which the flatness of the semiconductor substrate is increased.

Also, according to the nineteenth to thirty-second aspects of the invention, the suction holes provided in the protruding portions and peripheral portion are vacuum drawn, thereby chucking the semiconductor substrate placed on the protruding portions and peripheral portion to the suction holes. As the inner diameter of the suction hole is smaller than the interval between adjacent protruding portions, it is possible to make the area in contact with the semiconductor substrate small in comparison with that in a heretofore known chucking device.

Also, according to the nineteenth and twentieth aspects of the invention, the plural suction holes are vacuum drawn at differing timings, thereby chucking the semiconductor substrate to the plural suction holes. Because of this, when holding a semiconductor substrate warped convexly or concavely on the front surface side, it is possible to vacuum draw the plural suction holes in accordance with the warpage of the semiconductor substrate. Consequently, it is possible to hold the semiconductor substrate while eliminating the warpage of the semiconductor substrate.

Also, according to the twenty-fourth aspect of the invention, after the flow velocity of the gas on the base portion side of the semiconductor substrate is made greater than the flow velocity of the gas on the side opposite to the base portion side of the semiconductor substrate, the plural suction holes are vacuum drawn, thereby chucking the semiconductor substrate to the plural suction holes. Because of this, it is possible to exert a negative pressure caused by a Bernoulli effect on the semiconductor substrate, and hold the semiconductor substrate after placing the semiconductor substrate on the protruding portions in a condition in which the flatness of the semiconductor substrate is increased.

According to the chucking device and chucking method according to the invention, an effect is achieved whereby it is possible to prevent a foreign object being caught between the device and a semiconductor substrate. Also, an effect is achieved whereby it is possible to hold the semiconductor substrate in a condition in which the semiconductor substrate flatness is maintained or increased.

BRIEF DESCRIPTION OF THE DRAWINGS

Also.

DESCRIPTION OF THE PREFERRED EMBODIMENTS

Figure 1:
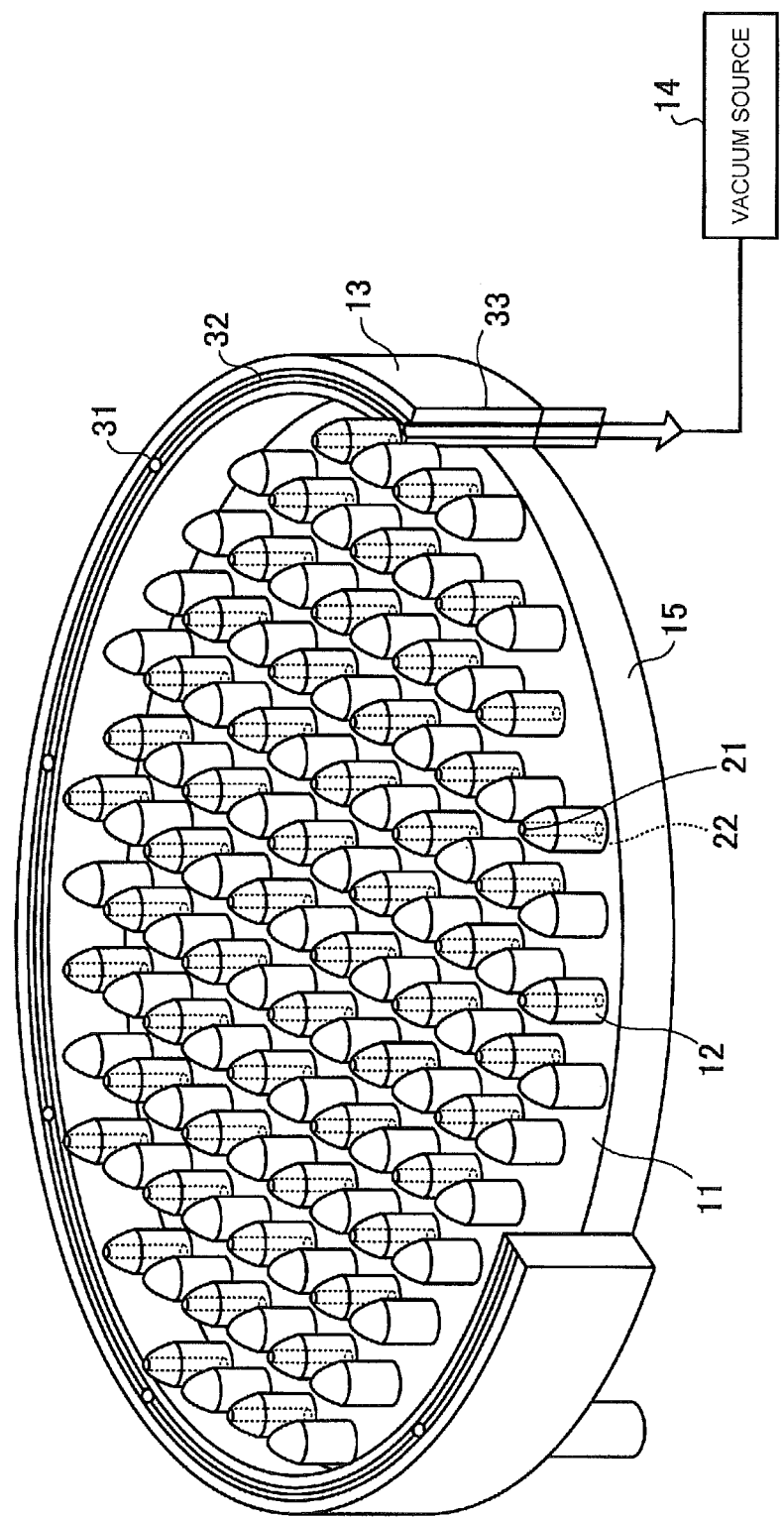
FIG. 1 is an illustration schematically showing a chucking device according to a first embodiment.

Hereafter, referring to the attached drawings, a detailed description will be given of preferred embodiments of a semiconductor device and semiconductor device manufacturing method according to the invention. In this specification and in the attached drawings, a layer or region being prefixed by n or p means that the electrons or holes respectively are majority carriers. Also, + or − affixed to n or p means that the layer or region is of a higher impurity concentration or lower impurity concentration than a layer or region to which n or p is not affixed. In the following descriptions of the embodiments and in the attached drawings, the same reference numerals or characters are given to the same configurations, and a redundant description is omitted.

First Embodiment

Figure 2:
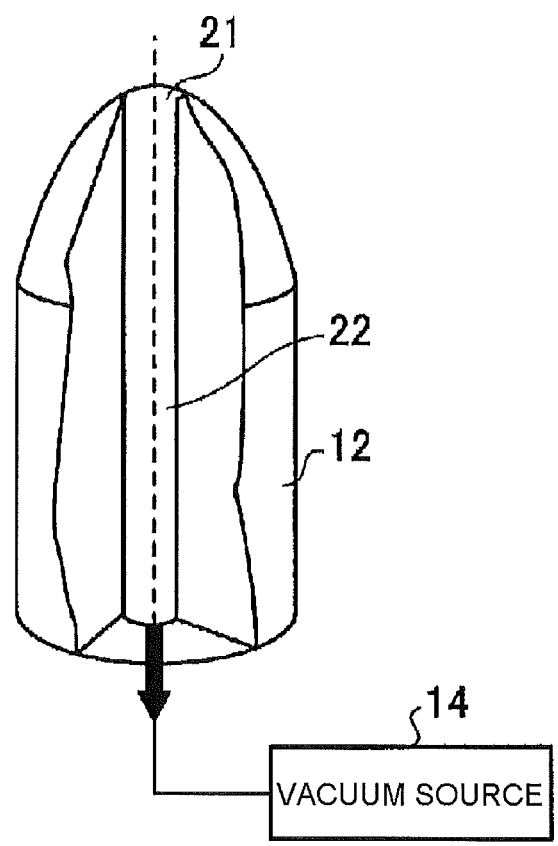
FIG. 2 is an illustration schematically showing parts configuring the chucking device shown in FIG. 1.
Figure 3:
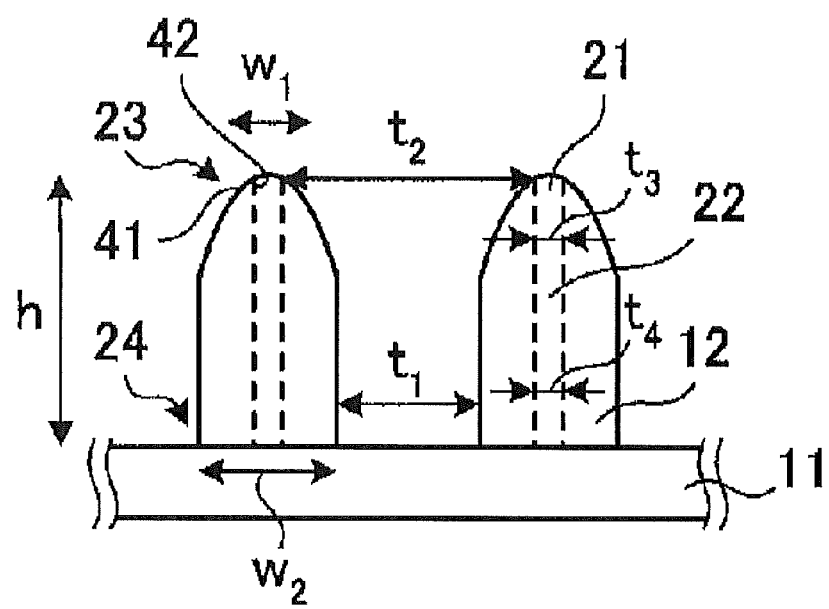
FIG. 3 is an illustration schematically showing parts configuring the chucking device shown in FIG. 1.

FIG. 1 is an illustration schematically showing a chucking device according to a first embodiment. Also, FIGS. 2 and 3 are illustrations schematically showing parts configuring the chucking device shown in FIG. 1. The chucking device shown in FIG. 1 includes a base portion 11 on which are provided a plurality of protruding portions 12 that support the central portion of a semiconductor substrate, a cylindrical peripheral portion 13 that supports the outer peripheral portion of the semiconductor substrate, a plurality of suction holes 21 and 31 that chuck the semiconductor substrate, and a vacuum source 14 that vacuum draws (e.g., produces a vacuum in) the plurality of suction holes at differing timings.

The base portion 11 has, for example, a circular planar shape. The diameter of the base portion 11 is a diameter slightly smaller than the diameter of the semiconductor substrate. Also, the base portion 11 may be configured of a material that has aluminum as a main component. A side surface 15 of the base portion 11 is formed from a material wherein minute gaps in the aluminum are infused (impregnated) with a fluorine resin.

The protruding portions 12 are disposed in, for example, a lattice form on the surface of the side of the base portion 11 that holds the semiconductor substrate. The protruding portions 12 may have, for example, a columnar form, or may have a rectangular sectional form. The diameter (or width, hereafter referred to simply as the width) of the protruding portions 12 may be, for example, 3 mm.

Also, the plurality of mutually independent vacuum drawable suction holes (hereafter referred to as first suction holes) 21 are provided in at least one portion of the protruding portions 12. The protruding portions 12 disposed in a lattice form may be configured in such a way that the protruding portions 12 in which the first suction holes 21 are provided and the protruding portions 12 in which no first suction hole 21 is provided are alternately disposed, as shown in FIG. 1. At this time, the width of the protruding portions 12 in which no first suction hole 21 is provided may be formed smaller than the width of the protruding portions 12 in which the first suction holes 21 are provided. The width of the protruding portions 12 in which no first suction hole 21 is provided may be, for example, 2 mm. By so doing, it is possible to reduce the area of contact with the semiconductor substrate. Also, the first suction holes 21 may also be provided in all of the protruding portions 12.

The first suction holes 21 have a circular planar shape. The diameter of the first suction holes 21 may be, for example, 1 mm. Ventilation holes (a vacuum system, hereafter referred to as first ventilation holes) 22 are provided inside the protruding portions 12, connected to the first suction holes 21 and penetrating the protruding portions 12. That is, the first suction holes 21 have a vacuum system independent from that of the other first suction holes 21 provided in the other protruding portions 12 (refer to FIG. 2).

The first ventilation holes 22 are linked to the vacuum source 14. The vacuum source 14 vacuum draws (e.g., produces a vacuum in) each first ventilation hole 22 independently. That is, the first ventilation holes 22 and the vacuum source 14 linked to the first ventilation holes 22 are each provided for the plurality of protruding portions 12. By the interior of each first ventilation hole 22 being independently vacuum drawn by the vacuum source 14, all of the first suction holes are independently vacuum drawn (e.g., a vacuum is independently produced in each of the first suction holes 21). That is, a negative pressure is generated independently in all of the first suction holes 21 by the vacuum source 14. Because of this, the semiconductor substrate supported by the protruding portions 12 is chucked by all of the first suction holes 21 at differing timings. Detailed conditions of the protruding portions 12 will be described hereafter.

The peripheral portion 13 surrounds the base portion 11 in contact with the side surface 15 of the base portion 11. Also, the peripheral portion 13 has a diameter slightly larger than the diameter of the semiconductor substrate. That is, when the semiconductor substrate is supported above the base portion 11, the protruding portions 12 are provided in positions whereby they support the central portion of the semiconductor substrate, and the peripheral portion 13 is provided in a position whereby it supports the outer peripheral portion of the semiconductor substrate.

The portion of the peripheral portion 13 in contact with the side surface 15 of the base portion 11 is formed from the same kind of material as the side surface 15 of the base portion 11. Because of this, it is possible to improve the tightness of a closed space formed by the semiconductor substrate (not shown), base portion 11, and peripheral portion 13. The peripheral portion 13 may also be detached from the base portion 11.

Plural mutually independent vacuum drawable suction holes (hereafter referred to as second suction holes) 31 and a ring-like groove portion 32 are provided in the end portion of the side of the peripheral portion 13 that supports the semiconductor substrate. It is desirable that the groove portion 32 is provided in a position corresponding to the side edge portion of the semiconductor substrate when the semiconductor substrate is supported by the peripheral portion 13. The width of the groove portion 32 may be, for example, 1 mm. Also, a circular groove portion 32 may be provided, or plural arc-shaped groove portions 32 may be provided. Also, ventilation holes (a vacuum system, hereafter referred to as second ventilation holes) 33 are provided inside the peripheral portion 13, connected to the second suction holes 31 and penetrating the peripheral portion 13.

That is, the second suction holes 31 have a vacuum system independent from that of the first suction holes 21 provided in the protruding portions 12. The second ventilation holes 33 are linked to the vacuum source 14. The vacuum source 14 vacuum draws (e.g., produces a vacuum in) the groove portion 32 via the second ventilation holes 33, independently of the first ventilation holes 22. Because of this, the semiconductor substrate supported by the peripheral portion 13 is chucked to the groove portion 32 at a timing differing from the timing at which the semiconductor substrate is chucked by the first suction holes 21. Conditions of the second suction holes 31 and second ventilation holes 33 are the same as those of the first suction holes 21 and first ventilation holes 22 respectively.

The vacuum source 14 has a function of independently vacuum drawing the interior of each of the first ventilation holes 22 linked to the first suction holes 21 and the interior of each of the second ventilation holes 33 linked to the second suction holes 31. That is, the plural first ventilation holes 22 and second ventilation holes 33 are connected to the vacuum source 14 by pipes (not shown) provided independently of each other, and the vacuum source 14 is provided for each of the pipes. Also, the vacuum source 14 may simultaneously vacuum draw the interiors of the first ventilation holes 22 linked to the first suction holes 21 and the interiors of the second ventilation holes 33 linked to the second suction holes 31.

The vacuum source 14 may vacuum draw the first suction holes 21 in order from the first suction holes 21 provided in positions whereby they support the outer peripheral portion side of the semiconductor substrate toward the first suction holes 21 provided in positions whereby they support the central portion side of the semiconductor substrate. In this case, the vacuum source 14 may vacuum draw the second suction holes 31 before vacuum drawing the first suction holes 21.

Also, the vacuum source 14 may vacuum draw the first suction holes 21 in order from the first suction holes 21 provided in positions whereby they support the central portion side of the semiconductor substrate toward the first suction holes 21 provided in positions whereby they support the outer peripheral portion side of the semiconductor substrate. In this case, the vacuum source 14 may vacuum draw the second suction holes 31 after vacuum drawing the first suction holes 21.

Next, a description will be given of detailed conditions of the protruding portion 12. As shown in FIG. 3, adjacent protruding portions 12 are disposed leaving, for example, a predetermined first interval $t_1$. The first interval $t_1$ may be in the region of, for example, 5 mm. The reason for this is as indicated below.

With the current semiconductor substrate processing accuracy, the cycle of warpage occurring in semiconductor substrates is in the region of, for example, 10 mm. This is because, when supporting plural places on this kind of semiconductor substrate with the plural protruding portions 12, leaving intervals, it is possible to keep wafer distortion within 13 nm by supporting the semiconductor substrate at a distance in the region of half the cycle of the warpage occurring in the semiconductor substrate.

In the current power semiconductor field, there is no requirement for the kind of overlay accuracy in the region of 50 nm required of an LSI manufacturing process. For this reason, the heretofore described kind of high wafer distortion in the region of 13 nm is not required. Consequently, when overlay accuracy and accuracy for semiconductor substrate sagging and wafer distortion are low, the first interval $t_1$ may be set wider than 5 mm.

Also, the protruding portion 12 may have a sectional shape wherein a width $w_1$ of a first end portion 23 on the side on which the semiconductor substrate is supported is narrower than a width $w_2$ of a second end portion 24 on the base portion 11 side, as shown in FIG. 3. That is, the interval between adjacent protruding portions 12 may be such that a second interval $t_2$ on the side supporting the semiconductor substrate is wider than the first interval $t_1$ on the base portion 11 side. Because of this, it is possible to increase the strength of a joint portion (the second end portion 24) of the protruding portion 12 and base portion 11, while decreasing the area of contact between the protruding portion 12 (the first end portion 23) and semiconductor substrate.

An inner diameter $t_3$ of the first suction hole 21 may be larger than an inner diameter $t_4$ of the first ventilation hole 22 connected to the first suction hole 21. Because of this, in a condition in which a dimension of the inner diameter $t_3$ of the first suction hole 21 whereby it is possible to stably chuck the semiconductor substrate is maintained, it is possible to adjust the chucking force chucking the semiconductor substrate by adjusting the inner diameter $t_4$ of the first ventilation hole 22. The same also applies for the second suction hole 31 (not shown).

It is preferable that a chamfering process is carried out on an angled portion 41, and an angled portion 42 of an opening portion of the first suction hole 21, of the first end portion 23 of the protruding portion 12. By forming the angled portions 41 and 42 of the portion (the first end portion 23) in contact with the semiconductor substrate in a curved form, it is possible to reduce the occurrence of scratches and the like on the semiconductor substrate. The same also applies for the second suction hole 31 (not shown).

It is preferable that the opening portion of the first suction hole 21 is formed horizontally with respect to the surface of the base portion 11. The reason for this is that it is possible to support the semiconductor substrate horizontally with respect to the base portion 11 when the semiconductor substrate is in contact with the first end portion 23 of the protruding portion 12. Also, it is because it is possible to completely chuck the semiconductor substrate to the first suction hole 21.

Heights (hereafter referred to as heights of the protruding portions 12) h of the protruding portions 12 from the surface of the base portion 11 are all aligned equally. That is, the heights h of the protruding portions 12 are aligned in such a way that it is possible to support the semiconductor substrate horizontally with respect to the base portion 11 above the base portion 11. Also, the heights h of the protruding portions 12 are equal to the height (hereafter referred to as the height of the peripheral portion 13) of the peripheral portion 13 from the surface of the base portion 11.

Figure 4:
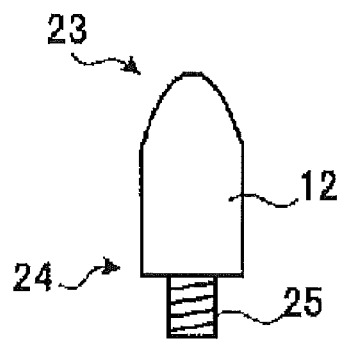
FIG. 4 is an illustration schematically showing another example of apart configuring the chucking device shown in FIG. 1.
Figure 5:
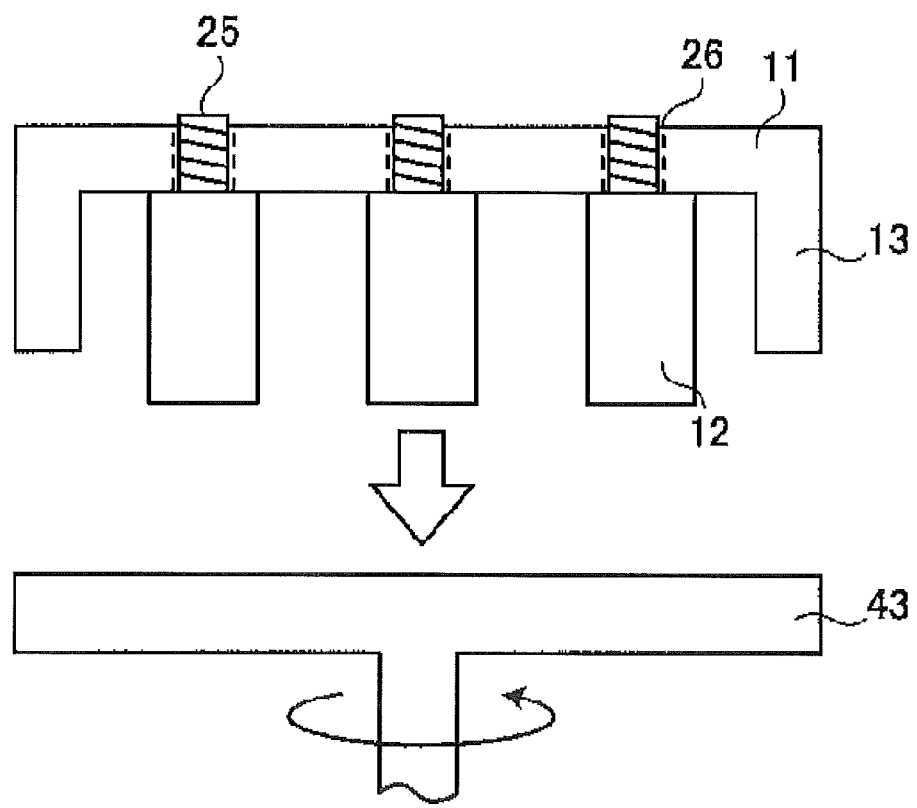
FIG. 5 is an illustration schematically showing an example of an assembly method for the part shown in FIG. 4.

Also, the base portion 11 and protruding portions 12 may have configurations for aligning the heights h of the protruding portions 12. FIG. 4 is an illustration schematically showing another example of a part configuring the chucking device shown in FIG. 1. Also, FIG. 5 is an illustration schematically showing an example of an assembly method for the part shown in FIG. 4. As shown in FIG. 4, a screw portion 25 is provided on the second end portion 24 side of the protruding portion 12. As shown in FIG. 5, a screw hole 26 that receives the screw portion 25 of the protruding portion 12 is provided in the base portion 11.

The screw portion 25 has a length such that it can be screwed into the screw hole 26 as far as a position at which it is equal to the heights of the other protruding portions 12 and the peripheral portion 13. Then, the screw hole 26 has at least a depth such that it can receive the screw portion 25 of the heretofore described length. The screw hole 26 may penetrate from the side on which the semiconductor substrate is supported to the opposite side. At this time, the leading end of the screw portion 25 screwed into the screw hole 26 may project to the outer side of the surface on the side opposite to the surface on the side on which the semiconductor substrate is supported.

After screwing the screw portion 25 into the screw hole 26, the first end portion 23 side of the protruding portion 12 may be ground, making the heights of all the protruding portions 12 and the peripheral portion 13 equal. In this case, even when not all the heights of the protruding portions 12 and the peripheral portion 13 are equal when the screw portion 25 is screwed into the screw hole 26, it is possible to align the heights of all the protruding portions 12 and the peripheral portion 13. Herein, in FIGS. 4 and 5, in order to clarify the forms of the protruding portion 12 and peripheral portion 13, the first and second suction holes 21 and 31 and first and second ventilation holes 22 and 33 are omitted from the drawings (the same also applies to FIGS. 6 to 15 hereafter).

Referring to FIG. 5, a description will be given of a method of assembling the protruding portion 12 that has the screw portion 25 and the base portion 11 that has the screw hole 26. Herein, a description will be given of a case of grinding the first end portion 23 side of the protruding portion 12. Firstly, the peripheral portion 13 is joined to the side surface of the base portion 11, as shown in FIG. 5. Next, the screw portion 25 of the protruding portion 12 is screwed into the screw hole 26 of the base portion 11 (an assembly step). Next, the first end portion 23 side of the protruding portion 12 is caused to face down, and brought into contact with, for example, a whetstone 43 that rotates in a horizontal direction. Then, the first end portion 23 side of the protruding portion 12 is ground until the height h of the protruding portion 12 is equal to that of the peripheral portion 13 (an adjustment step). By so doing, the heights of all the protruding portions 12 and the peripheral portion 13 are aligned. Next, a chamfering process is carried out on the first end portion 23 of the protruding portion 12 (refer to FIG. 4). By so doing, the base portion 11 on which the plural protruding portions 12 are provided is completed.

Figure 6:
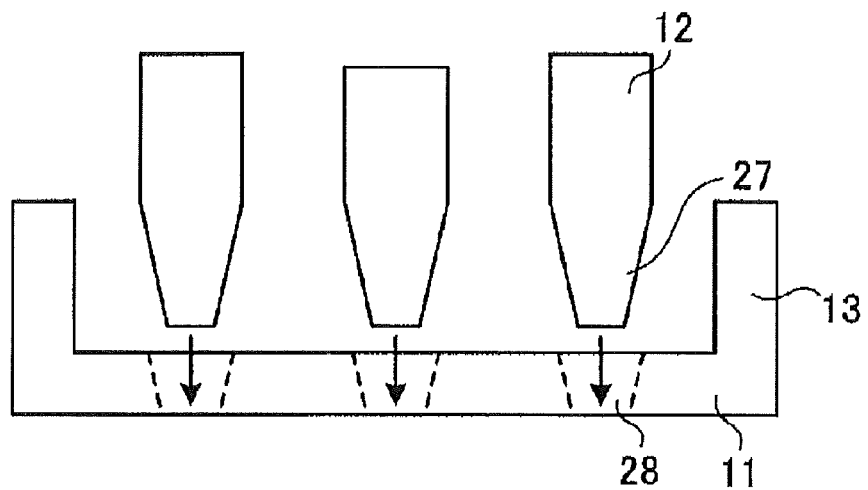
FIG. 6 is an illustration schematically showing another example of a method of assembling parts configuring the chucking device shown in FIG. 1.
Figure 7:
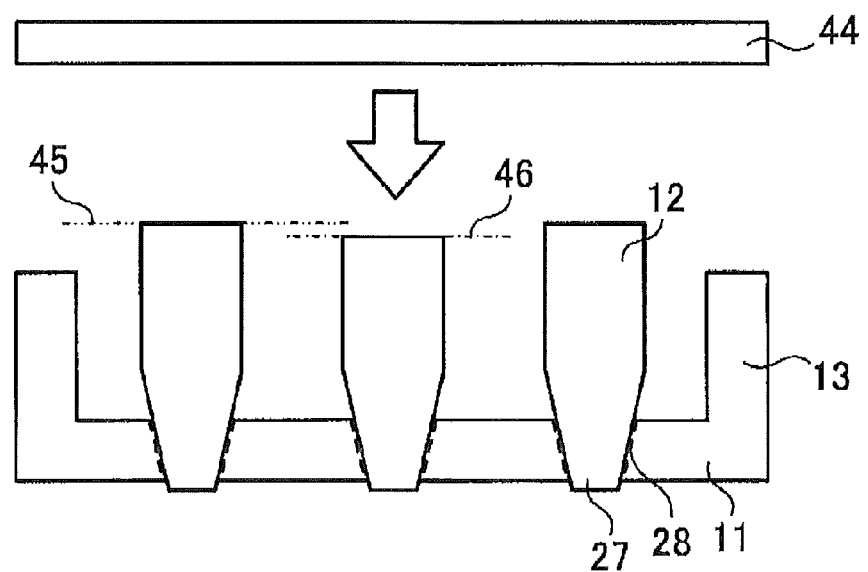
FIG. 7 is an illustration schematically showing another example of a method of assembling parts configuring the chucking device shown in FIG. 1.

FIGS. 6 and 7 are illustrations schematically showing another example of a method of assembling parts configuring the chucking device shown in FIG. 1. The protruding portion 12 may have a form such that the width of the second end portion 24 side gradually decreases toward the leading end, as shown in FIGS. 6 and 7. Hereafter, a portion on the second end portion 24 side of the protruding portion 12 whose width gradually decreases toward the leading end is referred to as a tapered portion 27. The tapered portion 27 may have a conical form, or it may have a polygonal pyramidic form. A hole (hereafter referred to as a tapered portion hole) 28 that receives the tapered portion 27 of the protruding portion 12 is provided in the base portion 11.

The tapered portion 27 has a configuration such that it is inserted into the tapered portion hole 28 as far as a position at which it is equal to the heights of the other protruding portions 12 and the height of the peripheral portion 13. Then, the tapered portion hole 28 has at least a depth such that it can receive the tapered portion 27 of the heretofore described length. The tapered portion hole 28 may penetrate from the side on which the semiconductor substrate is supported to the opposite side. At this time, the leading end of the tapered portion 27 inserted into the tapered portion hole 28 may project to the outer side of the surface on the side opposite to the surface on the side on which the semiconductor substrate is supported.

Also, the tapered portion hole 28 has a form such that it can fix the protruding portion 12 vertically with respect to the surface of the base portion 11 when the tapered portion 27 is inserted. For example, the tapered portion hole 28 has a width slightly smaller than that of the widest portion of the tapered portion 27. The width of the tapered portion hole may gradually decrease from the side on which the semiconductor substrate is supported toward the opposite side, or the width of the tapered portion hole 28 may be the same from the side on which the semiconductor substrate is supported toward the opposite side.

After the tapered portion 27 is inserted into the tapered portion hole 28, the tapered portion 27 may be further pushed into the tapered portion hole 28, making the heights of all the protruding portions 12 and the peripheral portion 13 equal. Also, the first end portion 23 side of the protruding portion 12 may be ground instead of pushing the tapered portion 27 into the tapered portion hole 28, or the tapered portion 27 may be pushed into the tapered portion hole 28 after the tapered portion 27 is inserted into the tapered portion hole 28, and furthermore, the first end portion 23 side of the protruding portion 12 subsequently ground. In this case, even when not all the heights of the protruding portions 12 and the peripheral portion 13 are equal when the tapered portion 27 is inserted into the tapered portion hole 28, it is possible to align the heights of all the protruding portions 12 and the peripheral portion 13.

Referring to FIGS. 6 and 7, a description will be given of a method of assembling the protruding portion 12 that has the tapered portion 27 and the base portion 11 that has the tapered portion hole 28. Herein, a description will be given of a case in which the tapered portion 27 is further pushed into the tapered portion hole 28 after the tapered portion 27 is inserted into the tapered portion hole 28. Firstly, the peripheral portion 13 is joined to the side surface of the base portion 11. Next, the tapered portion 27 of the protruding portion 12 is inserted into the tapered portion hole 28 of the base portion 11 (an assembly step).

Next, pressure is applied to all the protruding portions 12 from the first end portion 23 side toward the base portion 11 using a member (plate) 44 with a flat surface, pressing the protruding portions 12 against the base portion 11. That is, the tapered portion 27 of the protruding portion 12 is pushed into the tapered portion hole 28 of the base portion 11 (an adjustment step). By so doing, the protruding portion 12 of which a height 45 projects to the outer side of a height 46 of other protruding portions 12 is aligned with the heights of the other protruding portions 12 and the peripheral portion 13.

In the adjustment step, the first end portion 23 side of the protruding portion 12 may be ground after the tapered portion 27 is pushed into the tapered portion hole 28 using the plate 44. Also, in the adjustment step, the first end portion 23 side of the protruding portion 12 may be ground after the assembly step, without carrying out a pushing in using the plate 44, thereby aligning the heights of all the protruding portions 12 and the peripheral portion 13. Next, a chamfering process is carried out on the first end portion 23 of the protruding portion 12. By so doing, the base portion 11 on which the plural protruding portions 12 are provided is completed.

With the heretofore described assembly methods, when the screw portion 25 is screwed into the screw hole 26, or the tapered portion 27 is inserted into the tapered portion hole 28 (hereafter referred to as attaching the protruding portion 12 to the base portion 11), it is preferable that, for example, the protruding portion 12 is attached in such a way that the height h of the protruding portion 12 is greater than the height of the peripheral portion 13. By so doing, it is possible to prevent the height h of the protruding portion 12 being less than the height of the peripheral portion 13. Also, the protruding portion 12 may be attached to the base portion 11 in such a way that the heights of all the protruding portions 12 and the peripheral portion 13 are aligned in the assembly step alone, without carrying out the adjustment step. By attaching the protruding portion 12 to the base portion 11 in this way, it is possible to align the heights h of all the protruding portions 12 equally, even when the height direction dimensions of the plural protruding portions 12 differ from each other.

Figure 8:
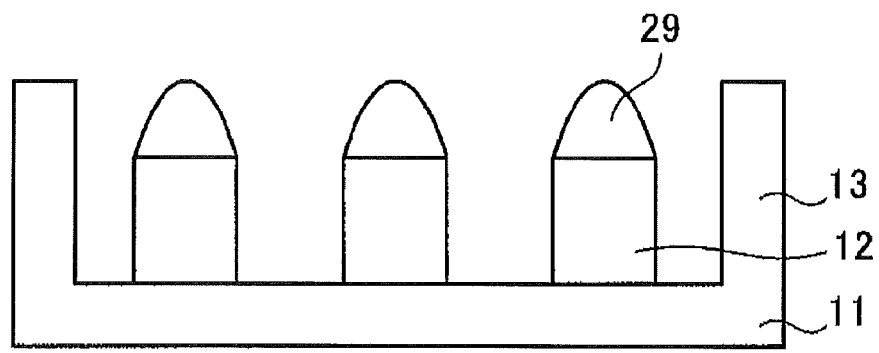
FIG. 8 is an illustration schematically showing another example of parts configuring the chucking device shown in FIG. 1.

FIG. 8 is an illustration schematically showing another example of parts configuring the chucking device shown in FIG. 1. A member 29 formed from a material that chucks an external force received from the semiconductor substrate supported on the protruding portion 12 may be provided on the first end portion 23 of the protruding portion 12, as shown in FIG. 8. The member 29 is formed from, for example, a soft material having an elasticity that absorbs the external force received from the semiconductor substrate supported on the protruding portion 12. By the member 29 being provided on the first end portion 23 of the protruding portion 12, the member 29 is transformed when the semiconductor substrate is placed on the first end portion 23 of the protruding portion 12. Because of this, it is possible to support the semiconductor substrate horizontally with respect to the base portion 11, even when there is variation in the heights of the protruding portions 12.

Also, in the above description, the peripheral portion 13 is disposed in a lattice form but, not being limited to this, a configuration may be such that the second suction holes 31 are not provided in the peripheral portion 13. Also, the protruding portions 12 may be disposed, for example, concentrically or in a houndstooth form.

Next, a description will be given of a method of holding the semiconductor substrate using the chucking device according to the first embodiment. The description will be given with the chucking device in which the first suction holes 21 are provided in all the protruding portions 12, and the second suction holes 31 are provided in the peripheral portion 13, as an example (hereafter, the same also applies to the chucking methods shown in FIGS. 9 to 15 and 18). Firstly, the semiconductor substrate is placed on the protruding portions 12 and peripheral portion 13 using, for example, a conveyor arm in such a way that the outer peripheral portion of the semiconductor substrate is superimposed on the peripheral portion 13.

Next, the interior of each of the first ventilation holes 22 linked to the plural first suction holes 21 is vacuum drawn at differing timings by the vacuum source 14 (a first chucking step). In the first chucking step, the interior of each of the first ventilation holes 22 linked to the plural first suction holes 21 may be simultaneously vacuum drawn by the vacuum source 14. Also, the interiors of the second ventilation holes 33 linked to the vacuum drawable second suction holes 31 are vacuum drawn by the vacuum source 14 independently of the first chucking step (a second chucking step). At this time, the second chucking step may be carried out after the first suction step, or the first suction step may be carried out after the second suction step.

By so doing, the plural first suction holes 21 and second suction holes 31 are vacuum drawn at differing timings. That is, the central portion of the semiconductor substrate is chucked to and supported by the first suction holes 21 provided in the protruding portions 12 studded at each first interval $t_1$. Also, the outer peripheral end portion of the semiconductor substrate is chucked to and supported by the second suction holes 31 provided in the peripheral portion 13.

The order in which the semiconductor substrate is chucked to the first suction holes 21 and second suction holes 31 can be changed in various ways. For example, in the first chucking step, the semiconductor substrate may be gradually chucked from the outer peripheral portion of the semiconductor substrate toward the central portion, or from the central portion of the semiconductor substrate toward the outer peripheral portion. In the second chucking step, the outer peripheral portion of the semiconductor substrate may be chucked before or after the first chucking step. Also, the first chucking step and second chucking step may be started simultaneously. For example, the vacuum drawing of the second suction holes 31 may be carried out simultaneously with that of the first suction hole 21 provided farthest to the outer side.

By chucking the semiconductor substrate to the first suction holes 21 of the protruding portions 12 in this way, even when the semiconductor substrate is warped, it is possible to chuck the semiconductor substrate while eliminating the warpage of the semiconductor substrate. For example, by forming a trench gate type IGBT with a rated current of 100 A and a breakdown voltage class of 1,700V on a semiconductor substrate with a diameter of eight inches and a thickness of 200 μm, when the semiconductor substrate, with a warpage of around 4 mm, is chucked with a vacuum chucking force of 40 kNm$^2$, it is possible to hold the semiconductor substrate onto the protruding portions 12 in a condition in which the warpage of the semiconductor substrate is eliminated, even when the first interval $t_1$ between the protruding portions 12 disposed in a lattice form is 20 mm. A description of a configuration of the trench gate type IGBT will be given hereafter.

Also, as the warpage of the semiconductor substrate is caused by the stress of a film formed on the semiconductor substrate surface, the form of the semiconductor substrate becomes a form that is warped symmetrically with the center of the semiconductor substrate as a reference. For this reason, by creating a temporal difference between the timings of vacuum drawing the first suction holes 21 and second suction holes 31, such as by carrying out the first chucking step after the second chucking step or carrying out the second chucking step after the first chucking step, it is possible to hold the semiconductor substrate while eliminating the warpage of the semiconductor substrate.

Figure 9:
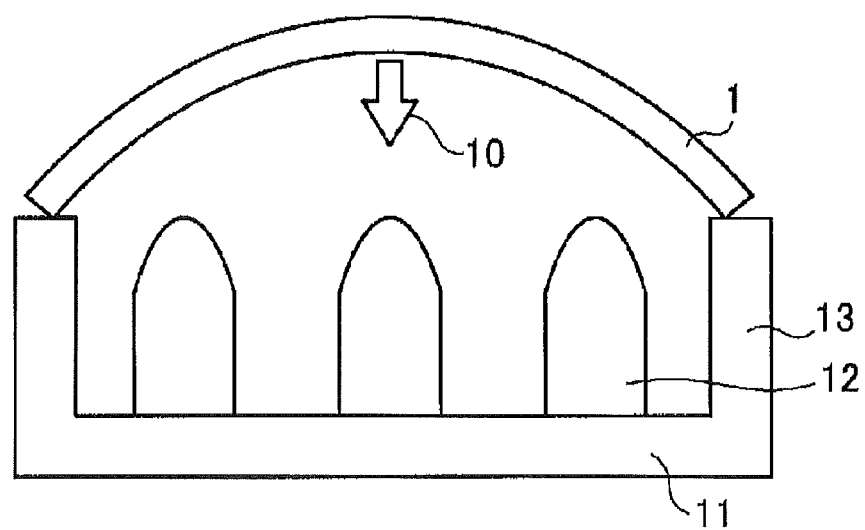
FIG. 9 is an illustration showing an example of a chucking method using the chucking device according to the first embodiment.
Figure 10:
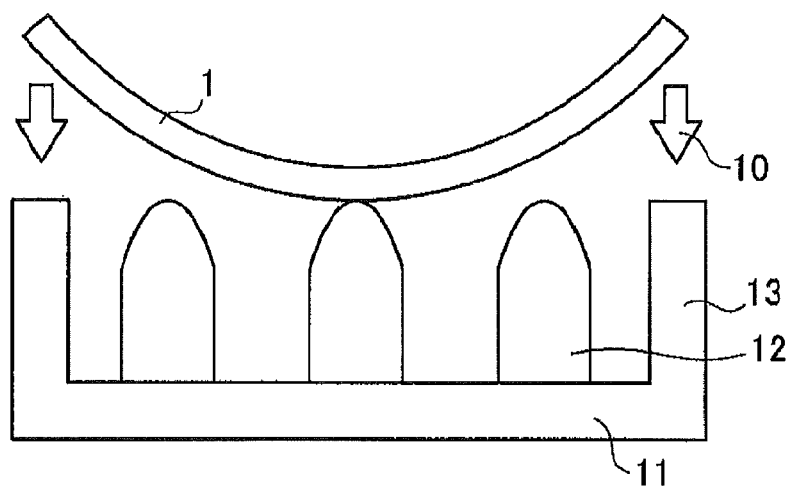
FIG. 10 is an illustration showing another example of a chucking method using the chucking device according to the first embodiment.

FIGS. 9 and 10 are illustrations showing another example of a chucking method using the chucking device according to the first embodiment. A semiconductor substrate 1 in a condition such that it is warped convexly or concavely on the front surface side due to various processes carried out in a manufacturing step may be chucked. When chucking the rear surface side of the semiconductor substrate 1 warped convexly on the front surface side, the central portion of the rear surface of the semiconductor substrate 1 does not come into contact with the protruding portions 12, and only the outer peripheral portion of the rear surface of the semiconductor substrate 1 comes into contact with the peripheral portion 13, as shown in FIG. 9. Because of this, the first chucking step is carried out after the second chucking step.

Meanwhile, when chucking the rear surface side of the semiconductor substrate 1 warped concavely on the front surface side, only the central portion of the rear surface of the semiconductor substrate 1 comes into contact with the protruding portions 12, and the outer peripheral portion side of the rear surface of the semiconductor substrate 1 does not come into contact with the other protruding portions 12 or the peripheral portion 13, as shown in FIG. 10. Because of this, the central portion of the rear surface of the semiconductor substrate 1 is chucked gradually from the central portion of the rear surface of the semiconductor substrate 1 toward the outer peripheral portion side in the first chucking step, and the second chucking step is carried out after that.

In this way, a temporal difference may be created between the timings at which each of the plural first suction holes 21 is vacuum drawn. When the warpage of the semiconductor substrate is not point symmetrical about the center of the semiconductor substrate, it is possible to change the timing at which each of the first suction holes 21 is vacuum drawn in accordance with the warpage of the semiconductor substrate, such as by chucking from the portion in which the warpage of the semiconductor substrate is deepest.

Also, the base portion 11 on which are provided the plural protruding portions 12 may be assembled before the first chucking step (refer to FIGS. 4 to 7). That is, the step of attaching the protruding portions 12 to the base portion 11 (the assembly step only, or the adjustment step after the assembly step) may be carried out before carrying out the first chucking step. Specifically, for example, after screwing the screw portion 25 of the protruding portion 12 into the screw hole 26 of the base portion 11 (the assembly step), the first end portion 23 of the protruding portion 12 may be ground, thereby aligning the heights h of all the protruding portions 12 (the adjustment process: refer to FIG. 5). By so doing, it is possible to carry out the first chucking step in a condition in which the heights h of all the protruding portions 12 are aligned equally, and it is possible to adjust the first interval $t_1$ between adjacent protruding portions 12 each time, in accordance with the diameter and warpage condition of the semiconductor substrate to be chucked.

Figure 21:
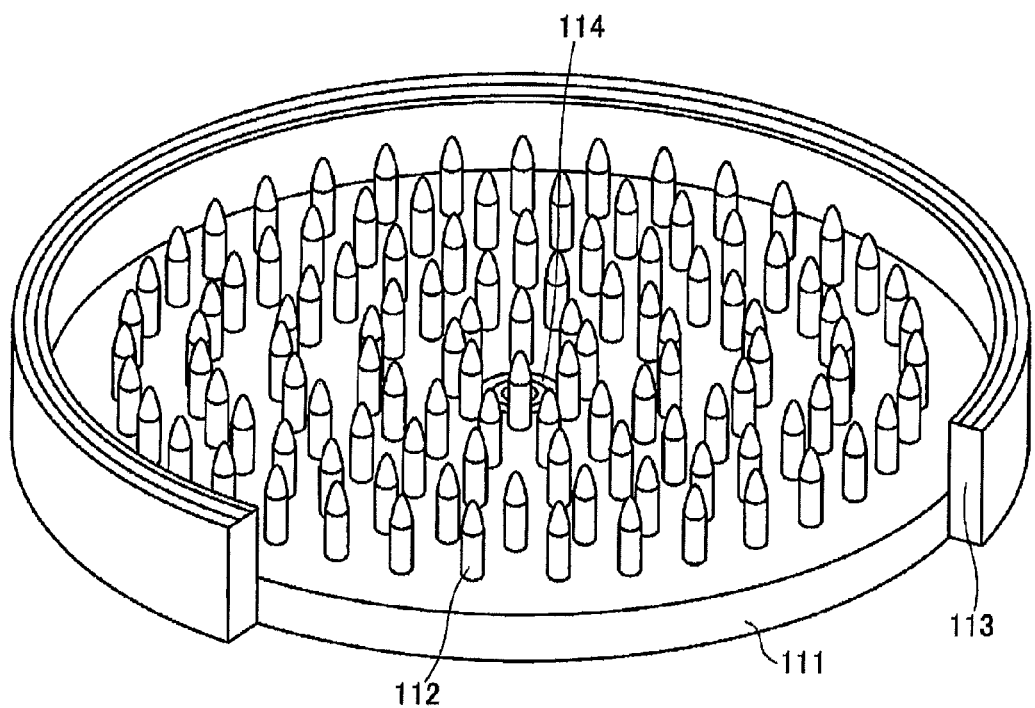
FIG. 21 is an illustration showing a heretofore known pin chuck type chucking device.
Figure 22:
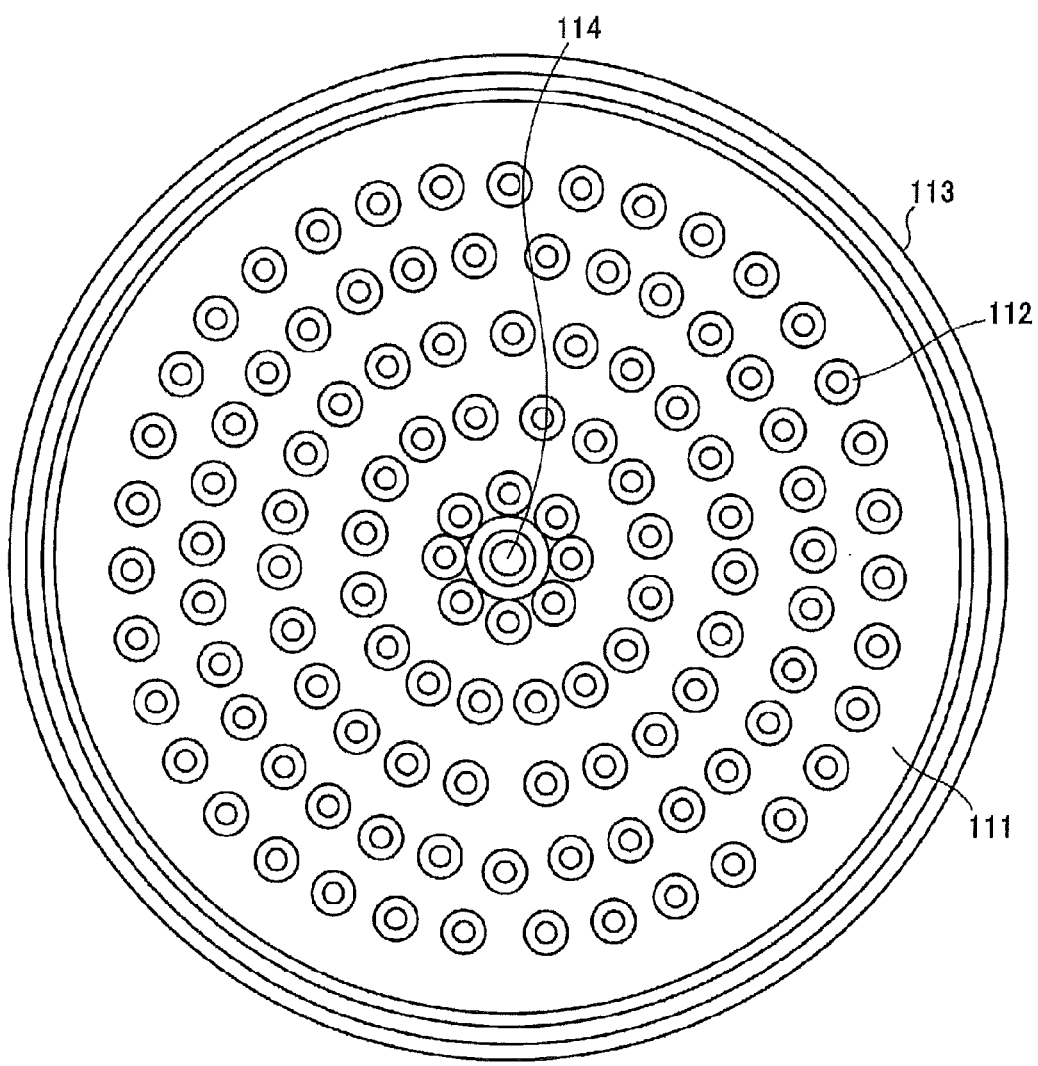
FIG. 22 is a plan view showing the chucking device of FIG. 21.

As heretofore described, according to the chucking device according to the first embodiment, the plural protruding portions 12 are provided on the base portion 11, and the first suction holes 21 are provided in the protruding portions 12. As the inner diameter $t_3$ of the first suction hole 21 is smaller than the first interval $t_1$ between adjacent protruding portions, it is possible to make the area in contact with the semiconductor substrate small in comparison with that in a heretofore known chucking device (refer to FIGS. 21 and 22). Because of this, it is possible to prevent a foreign object being caught between the protruding portion 12 and the semiconductor substrate. Also, by adjusting the first interval $t_1$ in accordance with the diameter, thickness, and warpage cycle of the semiconductor substrate, it is possible to hold the semiconductor substrate while eliminating the warpage of the semiconductor substrate. Because of this, it is possible to hold the semiconductor substrate in a condition in which the flatness of the semiconductor substrate is increased.

Also, the peripheral portion 13 that supports the outer peripheral portion of the semiconductor substrate is provided, and the second suction holes 31 are provided in the peripheral portion 13. Because of this, it is possible to chuck only the outer peripheral portion of the semiconductor substrate to the second suction holes 31 provided in the peripheral portion 13 before chucking, or after chucking, the central portion of the semiconductor substrate to the first suction holes 21 provided in the protruding portions 12. By so doing, even when the semiconductor substrate is considerably warped, it is possible to hold the semiconductor substrate in a condition in which the warpage of the semiconductor substrate is eliminated. Also, by making the heights of the plural protruding portions 12 equal, it is possible to hold the semiconductor substrate onto the base portion 11 horizontally with respect to the base portion 11.

Also, the first and second suction holes 21 and 31 are provided in the protruding portions 12 and peripheral portion 13. Because of this, no external force caused by vacuum drawing is exerted on a portion of the semiconductor substrate between adjacent protruding portions 12, or between the protruding portion 12 and peripheral portion 13. As the inner diameters of the first and second suction holes 21 and 31 are smaller than the first interval $t_1$ between adjacent protruding portions 12, it is possible to reduce the vacuum chucking force exerted on the semiconductor substrate significantly in comparison with the heretofore known chucking device (refer to FIGS. 21 and 22), wherein an external force caused by vacuum drawing is exerted on a portion of the semiconductor substrate between adjacent protruding portions. Because of this, it is possible to keep the sagging and wafer distortion of the semiconductor substrate within the range of the tolerance values required in the element design. That is, it is possible to hold the semiconductor substrate in a condition in which the flatness of the semiconductor substrate is maintained.

Also, the vacuum source 14 vacuum draws each of the first suction holes 21 and second suction holes 31 independently at differing timings. Because of this, when chucking a semiconductor substrate warped convexly or concavely on the front surface side, it is possible to vacuum draw the first suction holes 21 and second suction holes 31 in accordance with the warpage of the semiconductor substrate. Consequently, it is possible to hold the semiconductor substrate in a condition in which the warpage of the semiconductor substrate is eliminated, that is, in a condition in which the flatness of the semiconductor substrate is increased.

Also, the first suction holes 21 are provided in at least one portion of the plural protruding portions 12. Because of this, by providing the first suction holes 21 in only the protruding portions 12 in a region in which chucking is necessary, it is possible to carry out the chucking with one chucking device, even when chucking semiconductor substrates with differing diameters, when chucking and processing a section cut out from a circular semiconductor substrate, or the like.

Also, according to the chucking method according to the first embodiment, the first and second suction holes 21 and 31 provided in the protruding portions 12 and peripheral portion 13 are vacuum drawn, chucking the semiconductor substrate placed on the protruding portions 12 and peripheral portion 13 to the first and second suction holes 21 and 31. As the inner diameters of the first and second suction holes 21 and 31 are smaller than the interval between adjacent protruding portions 12, it is possible to reduce the area of contact with the semiconductor substrate in comparison with that in the heretofore known chucking device. Because of this, it is possible to prevent a foreign object being caught between the protruding portion 12 and the semiconductor substrate.

Also, the plural first suction holes 21 and second suction holes 31 are vacuum drawn at differing timings, chucking the semiconductor substrate to the first and second suction holes 21 and 31. Because of this, when chucking a semiconductor substrate warped convexly or concavely on the front surface side, it is possible to vacuum draw the first suction holes 21 and second suction holes 31 in accordance with the warpage of the semiconductor substrate. Consequently, it is possible to hold the semiconductor substrate in a condition in which the warpage of the semiconductor substrate is eliminated. That is, it is possible to hold the semiconductor substrate in a condition in which the flatness of the semiconductor substrate is increased.

Second Embodiment

Figure 11:
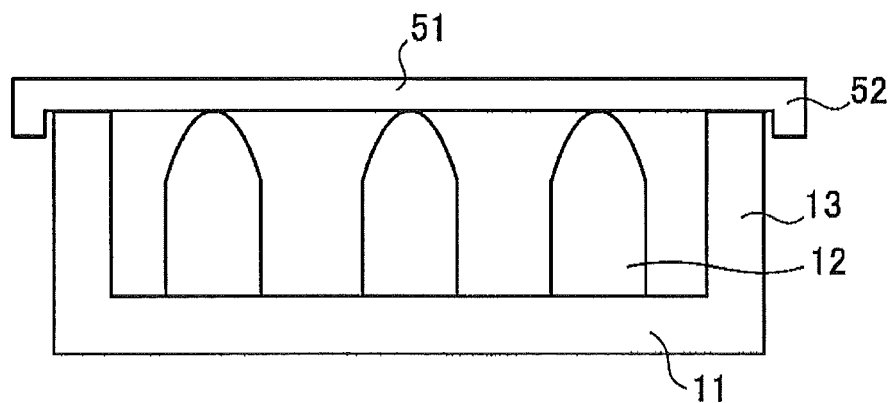
FIG. 11 is an illustration showing a chucking method using the chucking device according to a second embodiment.

FIG. 11 is an illustration showing a chucking method using a chucking device according to a second embodiment. In the first embodiment, a semiconductor substrate (hereafter referred to as a rib wafer) 51, which has a stepped form owing to a peripheral portion 52 left thickly around the outer perimeter, may be chucked.

In the second embodiment, as shown in FIG. 11, only a depressed portion farther to the interior than the peripheral portion 52 on a main surface side of the rib wafer 51, which has a stepped form owing to the peripheral portion 52, is chucked to the first suction holes 21 provided in the protruding portions 12 and the second suction holes 31 provided in the peripheral portion 13. Also, the heights h of the protruding portions 12 may be made higher than the height of the peripheral portion 13, and the depressed portion of the rib wafer 51, which is thinner owing to the peripheral portion 52, chucked to only the first suction holes 21 provided in the protruding portions 12 (not shown). In this case, the peripheral portion 52 of the rib wafer 51 may be chucked to the second suction holes 31 provided in the peripheral portion 13. The configuration of the chucking device and the chucking method are the same as in the first embodiment.

As heretofore described, according to the second embodiment, it is possible to obtain the same advantage as in the first embodiment.

Third Embodiment

Figure 12:
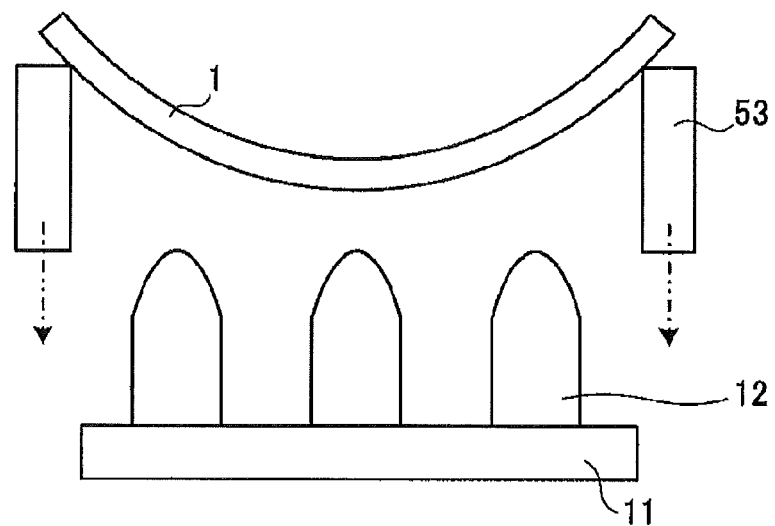
FIG. 12 is an illustration showing a chucking method using the chucking device according to a third embodiment.
Figure 13:
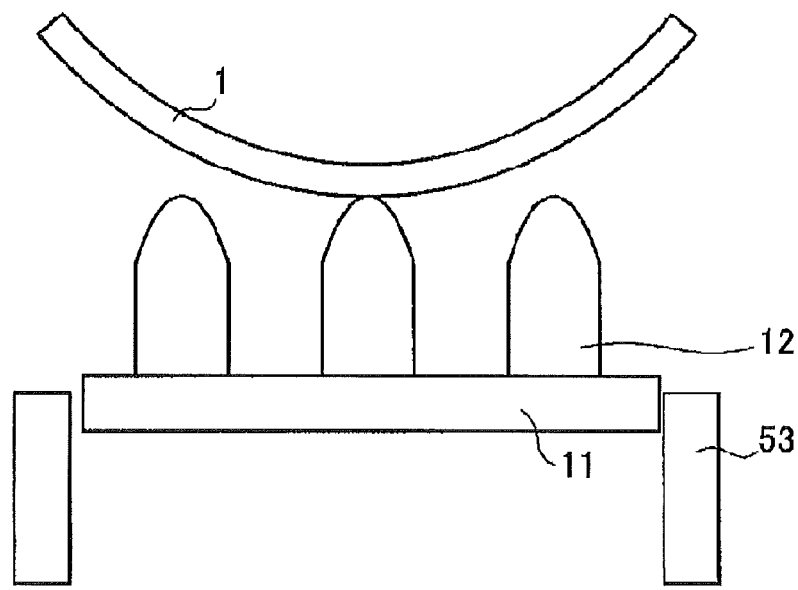
FIG. 13 is an illustration showing a chucking method using the chucking device according to the third embodiment.

FIGS. 12 and 13 are illustrations showing a chucking method using a chucking device according to a third embodiment. In the first embodiment, a peripheral portion 53 may be provided in such a way as to be able to rise and descend in a vertical direction with respect to the surface of a semiconductor substrate supported on the peripheral portion 53.

A description will be given of the chucking method of the third embodiment with a case of, for example, chucking the rear surface side of a semiconductor substrate warped concavely on the front surface side as an example. Firstly, using a conveyor arm (not shown) or the like, the semiconductor substrate 1 is placed with the rear surface facing down on the peripheral portion 53 installed in such a way as to be able to rise and descend above the base portion 11, as shown in FIG. 12. Next, a second step is carried out, chucking the outer peripheral portion of the rear surface of the semiconductor substrate 1 to the second suction holes 31 provided in the peripheral portion 53.

Next, the peripheral portion 53 is lowered, bringing the central portion of the rear surface of the semiconductor substrate 1 into contact with all the protruding portions 12, as shown in FIG. 13. At this time, a downward external force caused by the peripheral portion 53 descending is exerted on the outer peripheral portion of the semiconductor substrate 1. Because of this, it is possible to place the semiconductor substrate 1 in a flat condition on the protruding portions 12. As heretofore described, the peripheral portion 53 has an inner diameter greater than that of the base portion 11. For this reason, the peripheral portion 53 does not come into contact with the base portion 11. Next, the first chucking step is carried out.

When the plural protruding portions 12 are vacuum drawn at differing timings in the first chucking step, the chucking to the second suction holes 31 of the peripheral portion 53 may be stopped partway through the first chucking step. For example, when the semiconductor substrate 1 is chucked gradually from the central portion toward the outer peripheral portion of the rear surface of the semiconductor substrate 1 in the first chucking step, the chucking to the second suction holes 31 of the peripheral portion 53 may be stopped at a timing at which the flatness of the semiconductor substrate 1 is maintained.

Herein, a description has been given of a chucking method using a semiconductor substrate warped concavely on the front surface side but, not being limited to this, the method may also be applied to a flat semiconductor substrate. Also, instead of moving the peripheral portion 53, a base portion provided in such a way as to be movable may be raised. Apart from this, the configuration of the chucking device and the chucking method are the same as in the first embodiment.

As heretofore described, according to the third embodiment, it is possible to obtain the same advantage as in the first embodiment.

Fourth Embodiment

Figure 14:
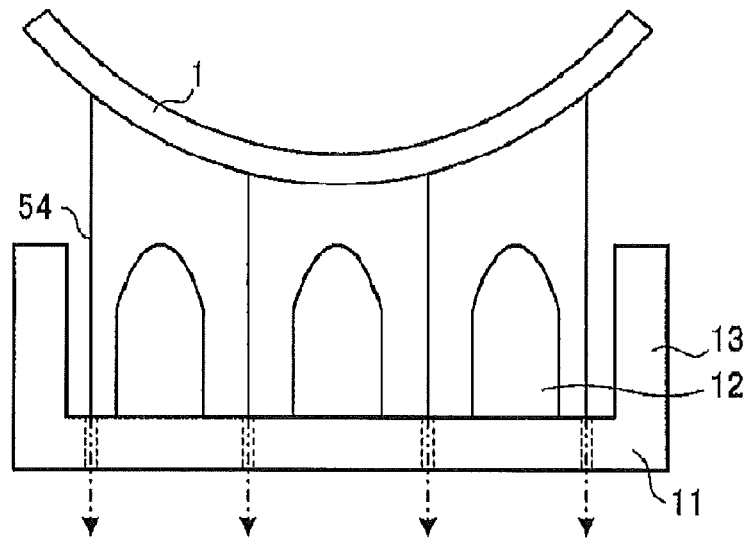
FIG. 14 is an illustration showing a chucking method using the chucking device according to a fourth embodiment.
Figure 15:
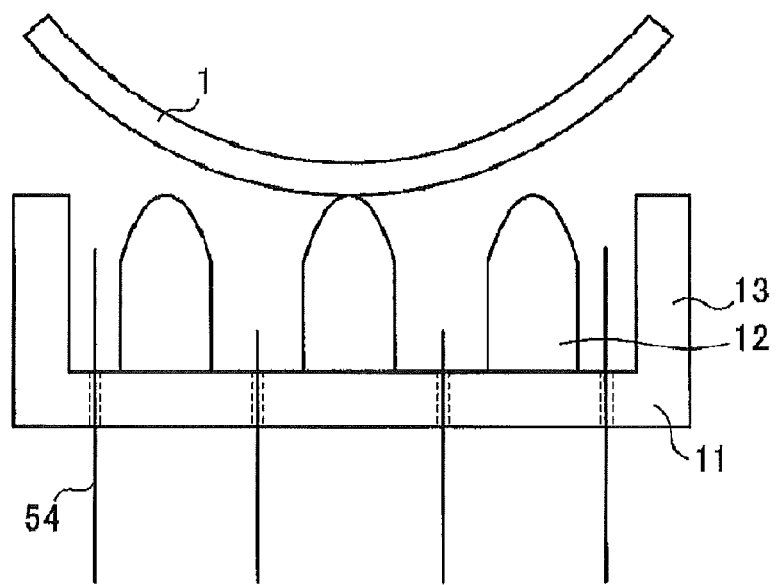
FIG. 15 is an illustration showing a chucking method using the chucking device according to the fourth embodiment.

FIGS. 14 and 15 are illustrations showing a chucking method using a chucking device according to a fourth embodiment. In the first embodiment, a movable holding portion 54 that holds the semiconductor substrate above the protruding portions 12 may be further included.

A description will be given of the chucking method of the fourth embodiment with a case of, for example, chucking the rear surface side of a semiconductor substrate warped concavely on the front surface side as an example. Firstly, using a conveyor arm (not shown) or the like, the semiconductor substrate 1 is placed with the rear surface facing down on the holding portion 54 installed in such a way as to be able to rise and descend above the base portion 11, as shown in FIG. 14.

Next, the holding portion 54 is lowered, bringing the central portion of the rear surface of the semiconductor substrate 1 into contact with the protruding portions 12, as shown in FIG. 15. At this time, a downward external force caused by the holding portion 54 descending is exerted on the central portion of the rear surface of the semiconductor substrate 1. Because of this, it is possible to place the semiconductor substrate 1 in a desired position on the protruding portions 12. Next, the first chucking step is carried out.

Herein, a description has been given of a chucking method using a semiconductor substrate warped concavely on the front surface side but, not being limited to this, the method may also be applied to a semiconductor substrate warped convexly on the front surface side, or to a flat semiconductor substrate. Also, instead of moving the holding portion 54, a base portion provided in such a way as to be movable may be raised. Apart from this, the configuration of the chucking device and the chucking method are the same as in the first embodiment.

As heretofore described, according to the fourth embodiment, it is possible to obtain the same advantage as in the first embodiment.

Fifth Embodiment

Figure 16:
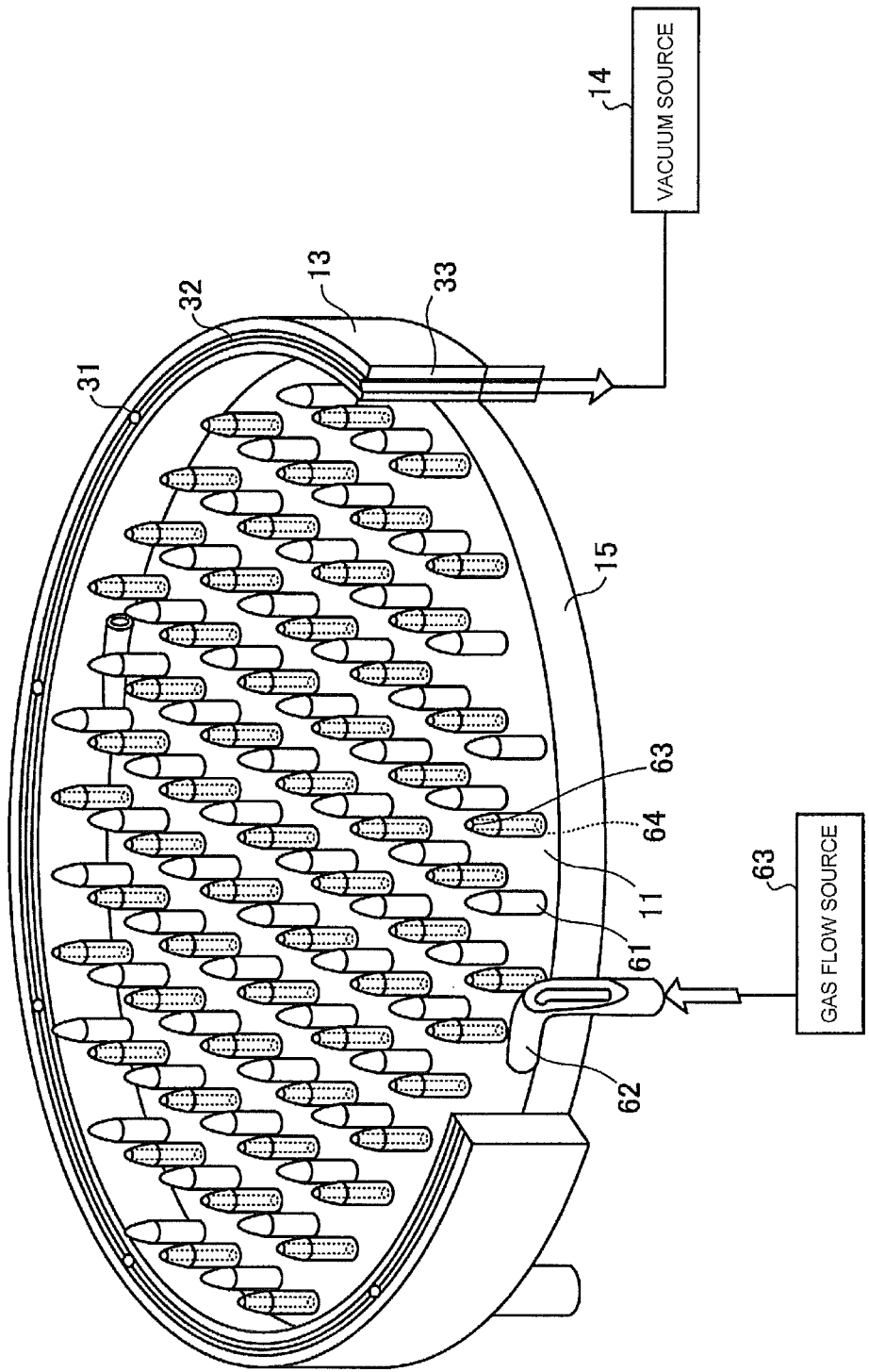
FIG. 16 is an illustration schematically showing a chucking device according to a fifth embodiment.
Figure 17:
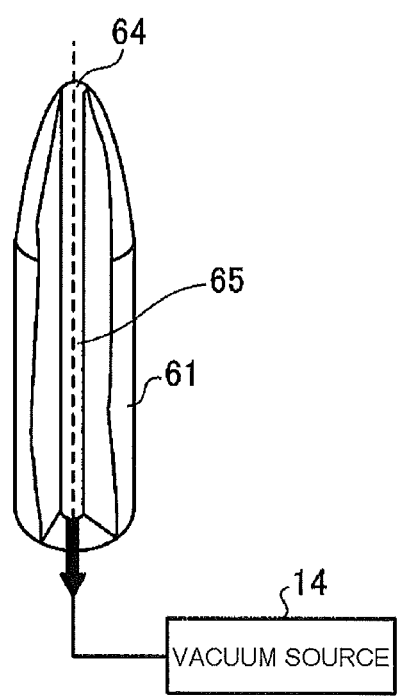
FIG. 17 is an illustration schematically showing a part configuring the chucking device shown in FIG. 16.

FIG. 16 is an illustration schematically showing a chucking device according to a fifth embodiment. Also, FIG. 17 is an illustration schematically showing a part configuring the chucking device shown in FIG. 16. In the first embodiment, a mechanism may be provided such that a gas is caused to flow through a space on the base portion 11 side of a semiconductor substrate placed above the base portion 11, and the flow velocity of the gas on the base portion 11 side of the semiconductor substrate is made greater than the flow velocity of the gas on the side opposite to the base portion 11 side of the semiconductor substrate.

In the fifth embodiment, there are provided an inflow pipe 62 that causes the gas to flow along the surface on a protruding portion 61 side of the base portion 11, a gas flow source 63 linked to the inflow pipe 62, and a control portion (not shown) that controls the vacuum source 14 and gas flow source 63, as shown in FIGS. 16 and 17. The inner diameters of a first suction hole 64 and first ventilation hole 65 of the protruding portion 61 may be, for example, 1 mm. The first interval $t_1$ may be, for example, 10 mm.

In the fifth embodiment, it is preferable that the diameter (the width $w_2$ of the second end portion 24) of the protruding portion 61 is of a width in a region such that it is possible to efficiently form a swirling flow in accordance with the gas flowing in from the inflow pipe 62. That is, it is preferable that the diameter of the protruding portion 61 is narrow to an extent that it does not block the flow path of the gas flowing in from the inflow pipe 62.

For example, when the first interval $t_1$ is 5 mm, it is preferable that the diameter of the protruding portion 61 is in the region of 2 mm. Also, when the first interval $t_1$ is 10 mm, it is preferable that the diameter of the protruding portion 61 is in the region of 4 mm. That is, it is preferable that the gas flow path blocked by the protruding portions 61 is in the region of one third of the surface area of the base portion 11.

The inflow pipe 62 is provided at an angle causing an inflow of the gas along the side wall of the peripheral portion 13, as though crawling on the surface of the base portion 11. For example, four inflow pipes 62 are provided one every 90 degrees on the end portion of the base portion 11 (only two are shown in FIG. 16). The orientations of the gas inflow openings of the inflow pipes 62 are aligned in the same direction along the perimeter of the base portion 11 so that the orientations of the gas flowing in from the inflow pipes 62 are the same. The gas inflow opening of the inflow pipe 62 is of a circular form, and the diameter thereof may be, for example, 2 mm.

The gas flow source 63 causes an inflow of gas into the space on the base portion 11 side of the semiconductor substrate in such a way that the flow velocity of the gas on the base portion 11 side of the semiconductor substrate placed above the base portion 11 is greater than the flow velocity of the gas on the side opposite to the base portion 11 side of the semiconductor substrate. The inflowing gas may be, for example, nitrogen ($N_2$).

By increasing the flow velocity of the gas flowing on the base portion 11 side of the semiconductor substrate using the gas flow source 63, the pressure exerted on the surface on the base portion 11 side of the semiconductor substrate is low in comparison with the pressure exerted on the surface on the side opposite to the base portion 11 side of the semiconductor substrate. That is, an energy saving law according to Bernoulli's theorem shown in Equation 5 below is established, and a negative pressure is generated in the semiconductor substrate in a direction pressing down to the base portion 11 side.

$$\tfrac{1}{2}\cdot\rho v^2 + P = \text{a constant} \quad (5)$$

Herein, $\rho$ is the gas density, v is the gas flow velocity, and P is the pressure. In Equation 5 above, the first item on the left hand side indicates the dynamic pressure, and the second item on the left hand side indicates the static pressure. According to Equation 5, it is possible to increase the negative pressure exerted on the semiconductor substrate by increasing the flow velocity of the inflowing gas using the gas flow source 63. The semiconductor substrate is pressed against and supported by the protruding portions 61 by the negative pressure. It is preferable that the flow rate and flow velocity of the inflowing gas are adjusted in various ways by the gas flow source 63 in accordance with the warpage condition of the semiconductor substrate.

The control portion, after increasing the flow velocity of the gas flowing on the base portion 11 side of the semiconductor substrate using the gas flow source 63, vacuum draws the first suction holes 64 and second suction holes 31 using the vacuum source 14. The configuration of vacuum drawing the first suction holes 64 and second suction holes 31 using the vacuum source 14 is the same as in the first embodiment.

Also, the control portion finishes the inflow of the gas from the inflow pipe 62 using the gas flow source 63 in conjunction with the closed space surrounded by the semiconductor substrate, base portion 11, and peripheral portion 13 being formed using the negative pressure exerted on the semiconductor substrate. Subsequently, the control portion starts the vacuum drawing using the vacuum source 14. The configuration apart from this is the same as in the first embodiment.

Next, a description will be given of a method of chucking the semiconductor substrate using the chucking device according to the fifth embodiment. Firstly, using a conveyor arm or the like, the semiconductor substrate is placed on the protruding portions 61 and peripheral portion 13 in such a way that the outer peripheral portion of the semiconductor substrate is superimposed on the peripheral portion 13. Next, the gas is caused to flow onto the base portion 11 side of the semiconductor substrate using the gas flow source 63, and the flow velocity of the gas flowing on the base portion 11 side of the semiconductor substrate is made greater than the flow velocity of the gas flowing on the side opposite to the base portion 11 side of the semiconductor substrate (a gas flow generation step). By so doing, negative pressure is exerted on the semiconductor substrate, and it is possible to narrow the distance between the semiconductor substrate and protruding portions 61. Next, the first chucking step is carried out after the gas flow generation step. Apart from this, the method is the same as in the first embodiment.

Also, as another example of the chucking device according to the fifth embodiment, plural the inflow pipes 62 may be provided in the center of the base portion 11, and the gas caused to flow in the direction of the perimeter radially from the center of the base portion 11. In this case, it is preferable that the protruding portions 61 are disposed radially along the perimeter of the base portion 11 in order to secure the gas flow path from the central side and end portion side of the base portion 11. By so doing, it is possible to reduce negative pressure loss caused by increasing the gas flow velocity. Because of this, it is possible to cause the gas flowing in from the central side of the base portion 11 to reach the end portion side of the base portion 11.

Also, the inner diameter of the peripheral portion 13 may be greater than the inner diameter of the semiconductor substrate. By so doing, when the semiconductor substrate comes into contact with the protruding portions 61 owing to the negative pressure exerted on the semiconductor substrate, a gap occurs between the semiconductor substrate and the peripheral portion 13. That is, the space surrounded by the semiconductor substrate, base portion 11, and peripheral portion 13 is not closed. Because of this, after the semiconductor substrate comes into contact with the protruding portions 61 owing to the inflow of gas from the inflow pipe 62, the gas flowing in from the inflow pipe 62 is expelled from the gap between the semiconductor substrate and the peripheral portion 13 even when the inflow of gas from the inflow pipe 62 is continued. Consequently, it is possible to start the vacuum drawing using the vacuum source 14 while continuing the inflow of gas from the inflow pipe 62. Because of this, it is no longer necessary for the control portion to strictly control the timing at which the inflow of gas from the inflow pipe 62 is finished.

Also, it being sufficient that the gas flow source 63 can increase the gas flow velocity on the base portion 11 side of the semiconductor substrate, the gas flow may be generated by, for example, suctioning the gas to the base portion 11 side of the semiconductor substrate, or the gas flow may be generated on the base portion 11 side of the semiconductor substrate by, for example, changing the form of the base portion 11, without providing the peripheral portion 13.

As heretofore described, according to the fifth embodiment, it is possible to obtain the same advantage as in the first embodiment. Also, according to the chucking device according to the fifth embodiment, there are provided the vacuum source 14 that carries out a vacuum drawing, the gas flow source 63 that causes an inflow of gas on the base portion 11 side of the semiconductor substrate, and the control portion that controls the vacuum drawing using the vacuum source 14 after the inflow of gas caused by the gas flow source 63. Because of this, it is possible to exert a negative pressure caused by a Bernoulli effect on the semiconductor substrate, and place the semiconductor substrate on the protruding portions 61 in a condition in which the flatness of the semiconductor substrate is increased. Then, as it is possible to subsequently carry out a vacuum drawing using the vacuum source 14, it is possible to hold the semiconductor substrate in a condition in which the flatness of the semiconductor substrate is increased. Also, it is possible to bring the semiconductor substrate into contact with all the protruding portions 61 in a flat condition, even in a condition in which the center of the semiconductor substrate warpage deviates from the center of the semiconductor substrate.

Also, according to the chucking method according to the fifth embodiment, the first chucking step is carried out after the gas flow generation step is carried out. Because of this, it is possible to exert a negative pressure caused by a Bernoulli effect on the semiconductor substrate, and chuck the semiconductor substrate after placing the semiconductor substrate on the protruding portions 61 in a condition in which the flatness of the semiconductor substrate is increased. For this reason, it is possible to hold the semiconductor substrate in a condition in which the flatness of the semiconductor substrate is increased.

Sixth Embodiment

Figure 18:
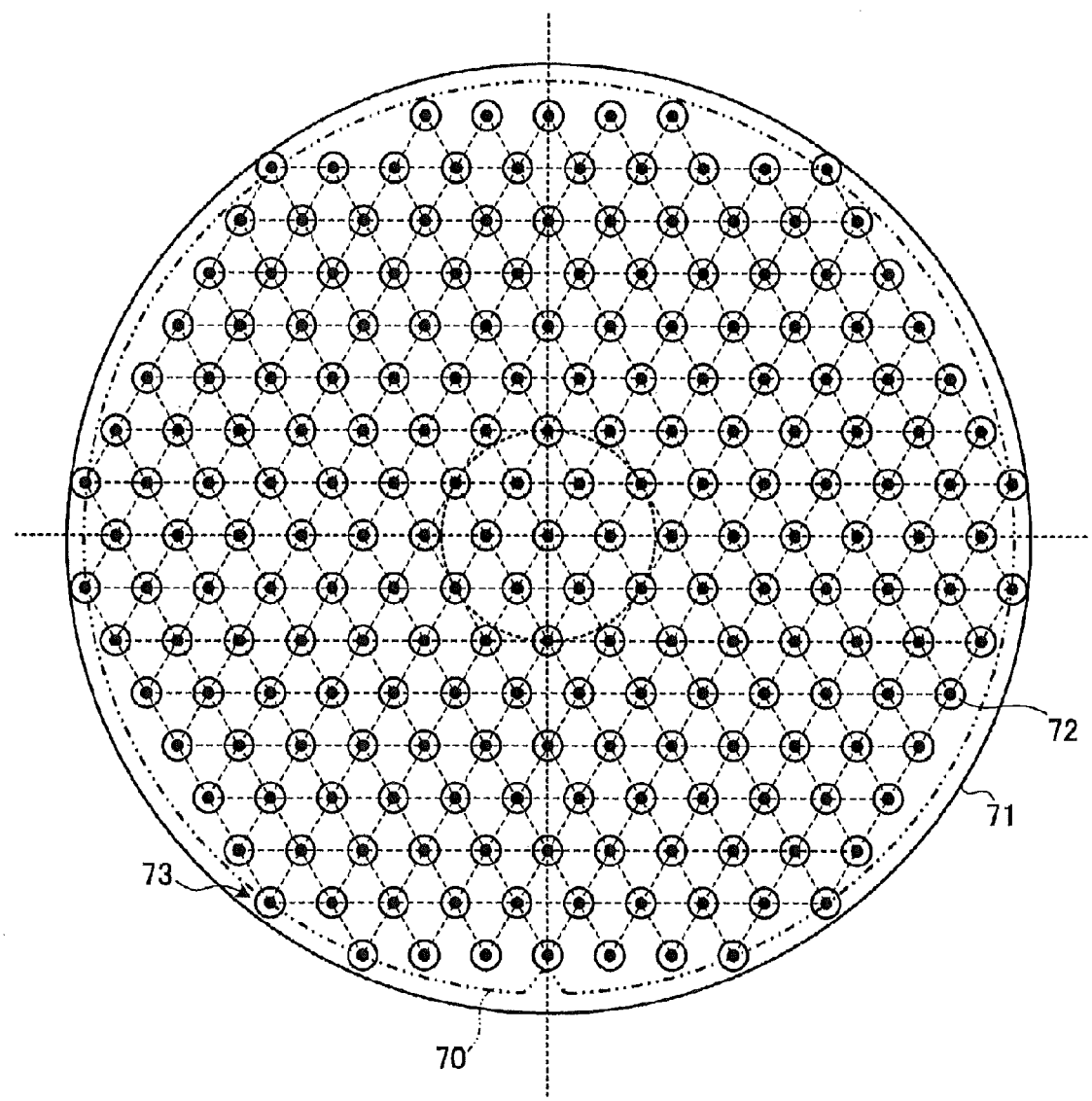
FIG. 18 is an illustration schematically showing a chucking device according to a sixth embodiment.

FIG. 18 is an illustration schematically showing a chucking device according to a sixth embodiment. In the first embodiment, a configuration wherein no peripheral portion 13 is provided may be chucked. Also, in the first and fifth embodiments, a disposition may be such that an equilateral triangle shape is formed by a protruding portion 72 and two other adjacent protruding portions 72.

In the sixth embodiment, one protruding portion 72 is disposed in the center of a position 70 on a base portion 71 in which a semiconductor substrate is placed, as shown in FIG. 18. Then, all the protruding portions 72 are disposed on the base portion 71 at equal intervals in such a way that the protruding portions 72 are disposed in positions at the apices of equilateral triangles of which the length of one side is, for example, 5 mm. In FIG. 18, adjacent protruding portions 72 are joined by dotted lines in order to clarify that adjacent protruding portions 72 are disposed in such a way as to form equilateral triangles.

Also, in the sixth embodiment, no peripheral portion 13 is provided. Instead of the peripheral portion 13, plural protruding portions 73 that support the outer peripheral portion of the semiconductor substrate are provided. That is, of the plural protruding portions 72, the protruding portions disposed on the outer peripheral portion of the position 70 in which the semiconductor substrate is placed are the protruding portions 73.

In the sixth embodiment, the protruding portions 72 are disposed in such a way that the first intervals $t_1$ between adjacent protruding portions 72 are the same but, not being limited to this, various changes are possible. For example, the protruding portions 72 may be disposed concentrically, centered on the protruding portion 72 disposed in the center of the position 70 in which the semiconductor substrate is placed.

Also, it is preferable that the first interval $t_1$ between adjacent protruding portions 72 is determined so that sagging and wafer distortion of the semiconductor substrate satisfy the tolerance values required in the element design. For example, when accuracy as far as nanometer units is not required, the first interval $t_1$ may be 50 mm. However, when the first interval $t_1$ is too large, it becomes difficult to chuck the semiconductor substrate while eliminating the semiconductor substrate warpage. With a semiconductor substrate on which is formed a trench gate type IGBT with, for example, a rated voltage of 600V and a rated current of 100 A, when the thickness of the semiconductor substrate after the IGBT is completed is, for example, 80 μm, the overall warpage is in the region of 15 mm. Because of this, it is preferable that the first interval $t_1$ is 50 mm or less.

As heretofore described, according to the sixth embodiment, it is possible to obtain the same advantage as in the first embodiment by disposing the protruding portions 72 in the way heretofore described.

Figure 19:
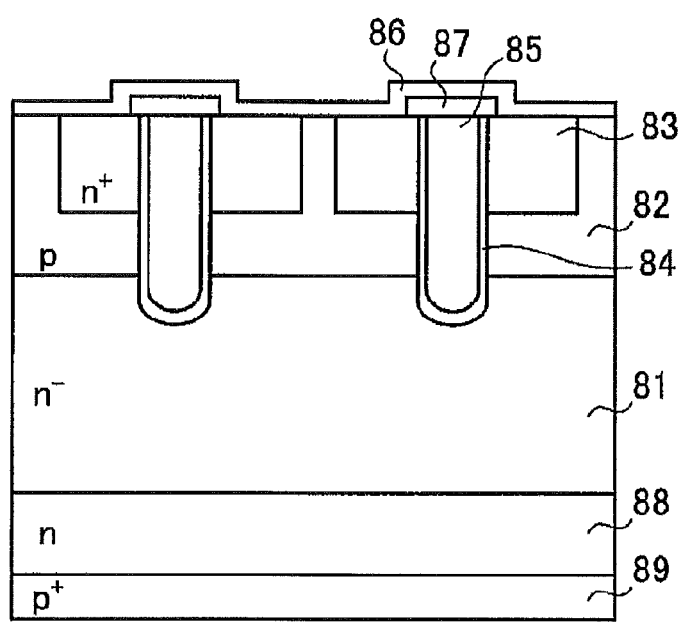
FIG. 19 is a sectional view showing a trench gate type IGBT.
Figure 20:
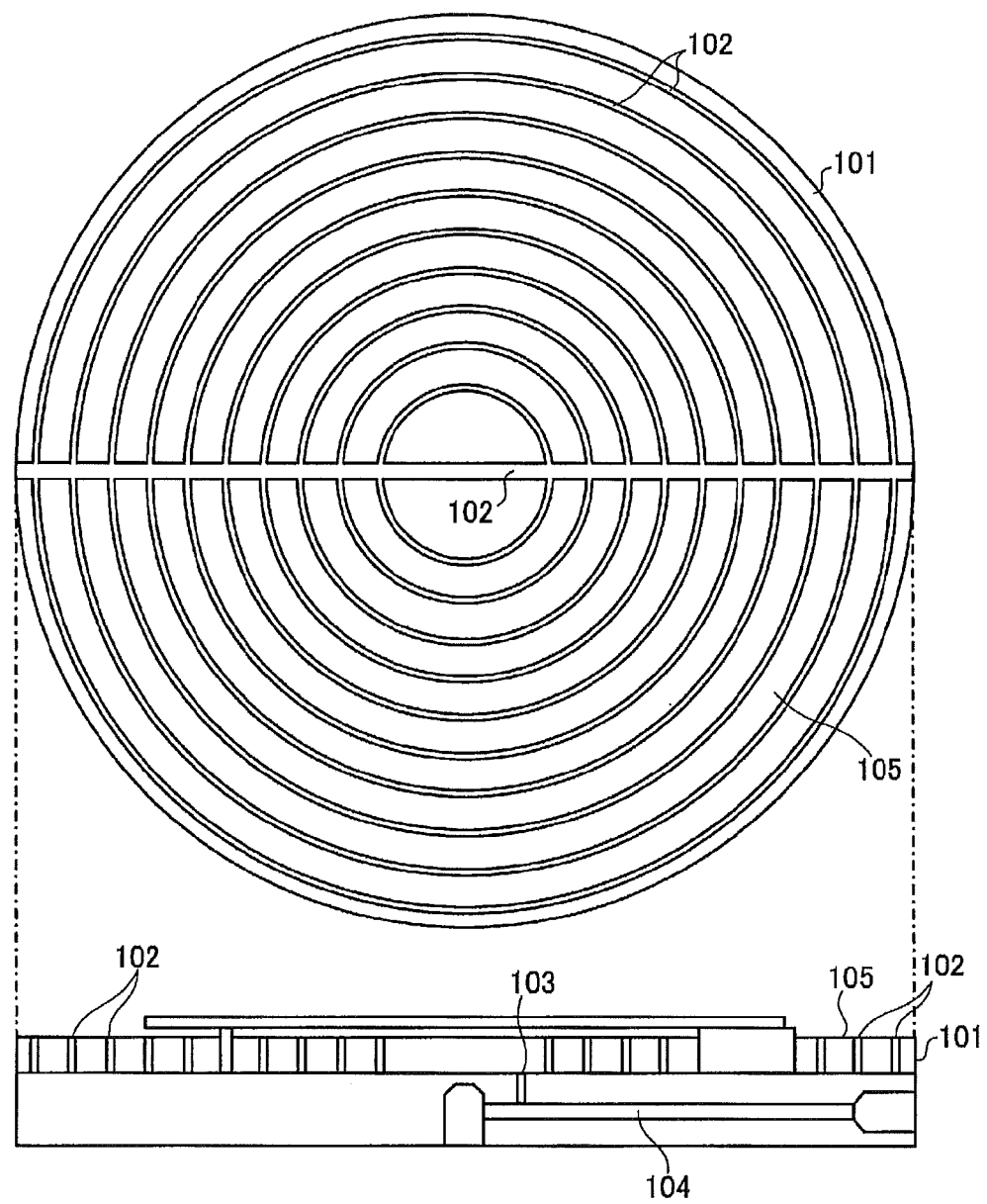
FIG. 20 is an illustration showing a heretofore known chucking device.

A description will be given of an example of a semiconductor device formed on a semiconductor substrate chucked by the chucking device shown in the first to sixth embodiments. FIG. 19 is a sectional view showing a trench gate type IGBT. The kind of trench gate type IGBT shown in FIG. 19 may be formed on a semiconductor substrate held by the chucking device. As shown in FIG. 19, the trench gate type IGBT is such that a p-base region 82 is provided on a surface layer of the front surface, which is an n⁻ drift region 81, of a semiconductor substrate. An n⁺ emitter region 83 is selectively provided on the surface layer of the p-base region 82.

A gate electrode 85 is provided across a gate insulating film 84 inside a trench that penetrates the n⁺ emitter region 83 and p-base region 82, and reaches the n⁻ drift region 81. An emitter electrode 86 is in contact with the n⁺ emitter region 83 and p-base region 82. Also, the emitter electrode 86 is isolated from the gate electrode 85 by an interlayer insulating film 87. An n-buffer region 88 and p⁺ collector region 89 are stacked in that order on a surface layer of the rear surface, which is the n⁻ drift region 81, of the semiconductor substrate.

WORKING EXAMPLE 1

An examination will be made of an external force exerted on a semiconductor substrate when the semiconductor substrate is chucked by the chucking device according to the invention. Setting of the chucking device is carried out in accordance with the first embodiment. The shape of the first suction hole 21 of the protruding portion 12 is circular, and the inner diameter $t_3$ thereof is 1 mm. The width $w_2$ of the protruding portions 12 in which the first suction hole 21 is provided is 3 mm. The width $w_2$ of the protruding portions 12 in which the first suction hole 21 is not provided is 2 mm. The first interval $t_1$ between adjacent protruding portions 12 is 5 mm. Also, a flat semiconductor substrate made from silicon (Si) is prepared. The thickness of the semiconductor substrate is 725 μm, and the lattice density of the semiconductor substrate is 2.3483 g/cm³.

Then, the external force exerted on the semiconductor device when the flat semiconductor substrate is chucked to the chucking device according to the first embodiment is calculated. Also, as a comparison, the external force exerted on the semiconductor device when the flat semiconductor substrate is chucked to a heretofore known chucking device (for example, refer to FIGS. 21 and 22) is calculated. The interval between adjacent protruding portions 12 of the heretofore known chucking device is the same as in the chucking device according to the first embodiment.

In the chucking device according to the first embodiment, no external force caused by vacuum drawing is exerted on a portion of the semiconductor substrate between adjacent protruding portions 12. Because of this, sagging and wafer distortion (the amount of positional deviation of a contact point with a protruding portion caused by the semiconductor substrate bending) of the semiconductor substrate in the semiconductor substrate between adjacent protruding portions is such that only the effect of the weight of the semiconductor substrate itself is taken into consideration. In this case, the gravitational force exerted on a 5 mm square portion of the semiconductor substrate supported by four adjacent protruding portions 12 is in the region of 0.000413847N.

Meanwhile, in the heretofore known chucking device, the semiconductor substrate is chucked and held by exerting a chucking force of, for example, approximately 12.4 kN/m² on a 5 mm square portion of the semiconductor substrate supported by four adjacent protruding portions 12. In this case, the negative pressure exerted on the 5 mm square portion of the semiconductor substrate is in the region of 0.31N. Consequently, it can be seen that with the chucking device according to the first embodiment, it is possible to reduce the external force exerted on the portion of the semiconductor substrate between adjacent protruding portions 12 to in the region of 1/1,000 of that with the heretofore known chucking method.

Also, with the chucking device according to the first embodiment, negative pressure is exerted on the one portion of the semiconductor substrate on the first suction hole 21. When seeing this as a material mechanics model that supports the portion of the semiconductor substrate on which the negative pressure is exerted at two support points, as the inner diameter $t_3$ of the first suction hole 21 is 1 mm, the negative pressure is exerted on only a 1 mm diameter circular portion of the semiconductor substrate, and it is possible to take the amount of sagging of the semiconductor substrate to be the amount of sagging occurring in the 1 mm diameter circular portion.

Herein, the amount of sagging is proportional to the fourth power of the distance between the support points. Also, the wafer distortion is proportional to the third power of the distance between the support points. Because of this, with the chucking device according to the first embodiment, it is possible to reduce the amount of sagging of the semiconductor substrate to in the region of 1/625, and it is possible to reduce the wafer distortion of the semiconductor substrate to in the region of 1/125, in comparison with the heretofore known chucking device wherein negative pressure is exerted on a 5 mm square portion of the semiconductor substrate formed by four adjacent protruding portions.

Also, the amount of sagging and wafer distortion of the semiconductor substrate are proportional to the vacuum chucking force when vacuum sucking the semiconductor substrate. With the chucking device according to the first embodiment, even supposing that a chucking force of 124 kN/m$^2$, ten times the chucking force (12.4 kN/m$^2$) exerted on the heretofore known chucking device, is exerted on the portion of the semiconductor substrate on which the negative pressure is exerted (the one portion of the semiconductor substrate on the first suction hole 21), the amount of sagging of the semiconductor substrate is in the region of 1/62.5, and the wafer distortion of the semiconductor substrate is in the region of 1/12.5. That is, it can be seen that with the chucking device according to the first embodiment, it is possible to make the amount of sagging and wafer distortion of the semiconductor substrate substantially smaller in comparison with the heretofore known chucking device.

WORKING EXAMPLE 2

An examination will be made of a semiconductor substrate warpage condition when the semiconductor substrate is chucked by the chucking device according to the fifth embodiment. Setting of the chucking device is carried out in accordance with the fifth embodiment. Four inflow pipes 62 are provided one every 90 degrees on the end portion of the base portion 11. The gas inflow opening of the inflow pipe 62 is of a circular form, and the diameter thereof is 2 mm.

Firstly, an eight inch semiconductor substrate is prepared, and a trench gate type IGBT (refer to FIG. 19) with a rated voltage of 1,200V and a rated current of 50 A is formed. The thickness of the semiconductor substrate after the IGBT is completed is 130 μm. Because of this, a concave warpage occurs in the front surface of the semiconductor substrate, and the amount of the warpage is 9 mm. Next, the semiconductor substrate concavely warped in the front surface is placed, with the front surface facing up, on the protruding portions 12 and peripheral portion 13 of the chucking device according to the fifth embodiment. Herein, the semiconductor substrate is placed in such a way that the outer peripheral portion of the semiconductor substrate is positioned above the peripheral portion 13.

Next, a gas flows from the gas inflow opening of each of the four inflow pipes 62 at a flow velocity of one liter per minute into a space on the base portion 11 side of the semiconductor substrate. It is found that because of this it is possible to approximate the semiconductor substrate to the plural protruding portions 12 in a condition in which the semiconductor substrate warpage is reduced by a Bernoulli effect. Next, the inflow of the gas from the inflow pipes 62 is stopped simultaneously with vacuum drawing the first suction hole 21 and second suction hole 31 with the vacuum source 14. The vacuum source 14 vacuum suction force is 40 kPa. It is found that because of this it is possible to hold the semiconductor substrate in a condition in which the semiconductor substrate warpage is eliminated.

Heretofore, a description has been given of the invention with a case of chucking a semiconductor substrate on which an element is formed as an example but, not being limited to the heretofore described embodiments, it is possible to apply the invention to various kinds of step in which a semiconductor substrate is held and a process carried out. For example, by applying the invention to an exposure step, it is possible to hold the semiconductor substrate so as to satisfy a semiconductor substrate flatness required for focal depth, and a semiconductor substrate flatness required for overlay accuracy. Also, the dimensions of the protruding portions and suction holes can be changed in various ways in accordance with the dimensions and warpage condition of the semiconductor substrate to be chucked.

As heretofore described, the chucking device and chucking method according to the invention are useful when holding a thin semiconductor substrate in a considerably warped condition.

What is claimed is:

1. A chucking method of a base portion having a plurality of protruding portions that support a semiconductor substrate that chucks a semiconductor substrate to suction holes provided in the protruding portions, the method comprising:
    providing a suction hole in at least one portion of the plurality of protruding portions;
    producing a vacuum at differing timings in the suction holes, the vacuum being produced in each suction hole independently of the other suction holes; and
    chucking the semiconductor substrate to the suction holes;
    wherein a surface of an interior side of a peripheral portion on a main surface side of the semiconductor substrate is chucked, the peripheral portion being left thickly around an outer perimeter and the main surface having a stepped form from the peripheral portion.

2. The chucking method according to claim 1, wherein producing a vacuum at differing timings in the suction holes includes carrying out chucking gradually from an outer peripheral portion of the semiconductor substrate toward a central portion, or from a central portion of the semiconductor substrate toward the outer peripheral portion.

3. The chucking method according to claim 1, further comprising:
    providing the suction holes that chuck an outer peripheral portion of the semiconductor substrate in a peripheral portion that supports the outer peripheral portion of the semiconductor substrate;
    producing a vacuum in the suction holes provided in the peripheral portion at a timing differing from that of producing a vacuum in the suction holes provided in the protruding portions; and chucking the outer peripheral portion of the semiconductor substrate to the suction holes provided in the peripheral portion.

4. The chucking method according to claim 3, wherein:
the outer peripheral portion of the semiconductor substrate is chucked to the suction holes of the peripheral portion installed above the protruding portions, the outer peripheral portion being configured to rise and descend when the vacuum is produced in the suction holes provided in the peripheral portion at the differing timing; and
producing the vacuum at differing timings in the suction holes is carried out after lowering the peripheral portion and bringing the semiconductor substrate into contact with the protruding portions.

5. The chucking method according to claim 1, wherein after holding the semiconductor substrate above the protruding portions using a holding portion, the holding portion being configured to rise and descend and to hold the semiconductor substrate, producing the vacuum at differing timings in the suction holes is carried out after lowering the holding portion, which brings the semiconductor substrate into contact with the protruding portions.

6. A chucking method of a base portion having a plurality of protruding portions that support a semiconductor substrate that chucks a semiconductor substrate to suction holes provided in the protruding portions, the method comprising:
making a flow velocity of a gas on a base portion side of the semiconductor substrate placed above the base portion greater than the flow velocity of the gas on a side opposite to the base portion side of the semiconductor substrate; and
producing a vacuum in a plurality of the suction holes provided in at least one portion of the protruding portions, and chucking the semiconductor substrate to the plurality of suction holes;
wherein a surface of an interior side of a peripheral portion on a main surface side of the semiconductor substrate is chucked, the peripheral portion being left thickly around an outer perimeter and the main surface having a stepped form from the peripheral portion.

7. The chucking method according to claim 6, further comprising aligning heights of the protruding portions from a surface of the base portion, and attaching the protruding portions to the base portion, before producing the vacuum in the plurality of the suction holes.

8. The chucking method according to claim 6, further comprising:
attaching the protruding portions to the base portion before producing the vacuum in the plurality of the suction holes; and
aligning the heights of all of the protruding portions from a surface of the base portion after attaching the protruding portions to the base portion.

9. The chucking method according to claim 7, wherein attaching the protruding portions to the base portion includes providing a screw portion in the protruding portion and screwing the screw portion into a screw hole configured to receive the screw portion of the protruding portion provided in the base portion.

10. The chucking method according to claim 7, wherein attaching the protruding portions to the base portion includes inserting the protruding portion into a hole provided in the base portion that is configured to receive the protruding portion.

11. The chucking method according to claim 8, wherein aligning the heights of all of the protruding portions includes pressing the protruding portion against the base portion from a side of the protruding portion that supports the semiconductor substrate.

12. The chucking method according to claim 8, wherein aligning the heights of all of the protruding portions includes grinding an end portion on a side of the protruding portion that supports the semiconductor substrate.

13. The chucking method according to claim 8, wherein aligning the heights of all of the protruding portions includes grinding an end portion on a side of the protruding portion that supports the semiconductor substrate after the protruding portion is pressed against the base portion from a side of the protruding portion that supports the semiconductor substrate.

14. A chucking method of a base portion having a plurality of protruding portions that support a semiconductor substrate that chucks a semiconductor substrate to suction holes provided in the protruding portions, the method comprising:
providing a suction hole in at least one portion of the plurality of protruding portions;
producing a vacuum at differing timings in the suction holes, the vacuum being produced in each suction hole independently of the other suction holes;
chucking the semiconductor substrate to the suction holes; and
providing the suction holes that chuck an outer peripheral portion of the semiconductor substrate in a peripheral portion that supports the outer peripheral portion of the semiconductor substrate;
wherein the outer peripheral portion is liftably provided above the protruding portions; and
wherein the outer peripheral portion is lowered so that at least one of the protruding portions contacts a center portion of a back surface of the semiconductor substrate.

* * * * *